(12) United States Patent
Ogawa

(10) Patent No.: US 6,885,110 B1
(45) Date of Patent: Apr. 26, 2005

(54) ELECTRICAL CIRCUIT BOARD AND TFT ARRAY SUBSTRATE AND LIQUID CRYSTAL DISPLAY DEVICE UTILIZING THE SAME

(75) Inventor: Kazufumi Ogawa, Nara (JP)

(73) Assignee: Matsushita Electric Industrial Co., Ltd. (JP)

( * ) Notice: Subject to any disclaimer, the term of this patent is extended or adjusted under 35 U.S.C. 154(b) by 162 days.

(21) Appl. No.: 10/070,554
(22) PCT Filed: Sep. 8, 2000
(86) PCT No.: PCT/JP00/06173
§ 371 (c)(1),
(2), (4) Date: Mar. 7, 2002
(87) PCT Pub. No.: WO01/18774
PCT Pub. Date: Mar. 15, 2001

(30) Foreign Application Priority Data

Sep. 8, 1999 (JP) .......................................... 11-254385

(51) Int. Cl.⁷ .............................................. H01L 23/58
(52) U.S. Cl. ........................ 257/798; 257/266; 257/327; 257/749; 257/750; 174/255; 174/260; 345/99; 345/100; 345/107; 349/49; 349/50
(58) Field of Search ................................ 257/798, 266, 257/327, 749, 750; 174/255, 260; 345/99, 100, 110, 107; 349/49, 50

(56) References Cited

U.S. PATENT DOCUMENTS 5,285,018 A * 2/1994 Pence, IV .................... 174/261
5,703,389 A * 12/1997 Knoch et al. ................. 257/327
5,995,178 A * 11/1999 Fujikawa et al. .............. 349/55
6,556,264 B1 * 4/2003 Hirakata et al. ............. 349/110

FOREIGN PATENT DOCUMENTS

| JP | 60-128486 | 12/1983 |
| JP | 01-101519 | 10/1987 |
| JP | 02-170135 | 12/1988 |
| JP | 04-280231 | 8/1991 |
| JP | 09-265113 | 3/1996 |
| JP | 10-48651 | 7/1996 |

* cited by examiner

Primary Examiner—David Nelms
Assistant Examiner—Long Tran
(74) Attorney, Agent, or Firm—Parkhurst & Wendel, L.L.P.

(57) ABSTRACT

TFT array substrates used for liquid crystal display panels are disclosed of which the fabrication processes are simplified and the manufacturing costs are reduced by reducing the number of masks used in fabricating the TFT array substrates. A gate wiring line metal film, a gate insulating film, a semiconductor film, and a contact electrode metal film are formed on a substrate surface. The contact electrode metal film, the semiconductor film, the gate insulating film, and the gate wiring line metal film are sequentially etched, by photolithography, using a first pattern, and the side surfaces of a gate wiring line metal film pattern, which is formed into portions of gate wiring lines and gate electrodes, are oxidized. A transparent conductive film is formed, and part of the transparent conductive film, the contact electrode metal film, and the semiconductor film are sequentially etched, by photolithography, using a second pattern.

4 Claims, 14 Drawing Sheets

(a)

(b)

(a)

(b)

(a)　　　(b)

281
282
283

ELECTRICAL CIRCUIT BOARD AND TFT ARRAY SUBSTRATE AND LIQUID CRYSTAL DISPLAY DEVICE UTILIZING THE SAME

TECHNICAL FIELD

The present invention relates to an innovative structure for electrical circuit boards having various applications, to TFT array substrates to which such electrical circuit boards are applied, and to liquid crystal display devices utilizing such TFT array substrates. The invention further relates to the fabrication methods of such electrical circuit boards, TFT array substrates, and liquid crystal display devices.

BACKGROUND ART

Conventionally, fabricating a TFT (Thin Film Transistor) array substrate for a color liquid crystal display device requires five to nine photomasks. As the number of photomasks to be used is increased, the number of the fabrication steps increases accordingly, and therefore the fabrication becomes complicated, making it difficult to reduce the fabrication cost.

Meanwhile, a technique for reducing the number of photomasks used in the fabrication process of a diode array substrate to two has been proposed (Published Japanese Translation of PCT International Publication for Patent Application No. 62-502361). However, the performance of diode array substrates is inferior to that of TFT (Thin Film Transistor) array substrates, and therefore the diode array substrate is not suitable for use in color televisions.

DISCLOSURE OF THE INVENTION

In view of the foregoing, it is a principal object of the invention to provide an innovative structure that allows for reduction in the number of photomasks necessary for fabricating a TFT array substrate.

(1) A first aspect of the present invention (first to seventh embodiments) for achieving this object relates to a structure for electrical circuit boards applicable to semiconductor integrated circuits and the like. The first aspect of the present invention includes the following.

There is provided an electrical circuit board comprising; X wiring lines and Y segmented wiring lines, each of the wiring lines being formed of a same conductive metal film and in a same plane on an insulating substrate and the Y segmented wiring lines intersecting with the X wiring lines, being severed by the X wiring lines at the intersections, and being distanced from the X wiring lines; wherein top and side surfaces of the X wiring lines are covered with an insulating film; and segments of each of the Y segmented wiring lines are electrically connected together by a Y segmented wiring line-connecting electrode formed on the insulating film.

With this construction, it is possible to build an X-Y wiring line intersection type electrical circuit, which allows an electric current to pass through independently, into an extremely thin plane, and therefore it is also possible to realize a multi-level integrated circuit. Hence, this construction is very compatible with semiconductor devices, and employing this construction allows remarkable increase in the degree of integration of semiconductor circuits and the like.

In this construction, the insulating film of at least the side surfaces of the X wiring lines may be a metal oxide film formed by oxidizing the conductive metal film. In addition, the metal oxide film may be an anodic oxide film formed by anodic oxidation. The anodic oxide film is preferable because such a film is thin and provides excellent insulation.

The electrical circuit board having the above-described construction may be fabricated by the following fabrication method, with great productivity. Specifically, the method comprising: a first step of depositing a conductive metal film layer over an insulating substrate; a second step of etching the conductive metal film layer to simultaneously form X wiring lines and Y segmented wiring lines in a same plane, the Y segmented wiring lines intersecting with the X wiring lines, being severed by the X wiring lines at the intersections, and being distanced from the X wiring lines; a third step, after the second step, of oxidizing top and side surfaces of the X wiring lines to cover the top and side surfaces by an insulating metal oxide film; and a fourth step, after the third step, of depositing a conductive film layer so as to cover at least the intersections, whereby segments of each of the Y segmented wiring lines are electrically connected together, each of the Y segmented wiring lines being severed by and distanced from the X wiring lines.

In this fabrication method, the third step of oxidizing the X wiring lines may be carried out by anodic oxidation. The anodic oxidation allows only the X wiring lines to be selectively and efficiently oxidized.

The electrical circuit board having the above-described construction may also be fabricated by the following method, with great productivity. Specifically, the method comprising: a first step of sequentially depositing at least a conductive metal film layer and an insulating film layer over an insulating substrate; a second step of etching layers including the insulating film layer and the conductive metal film layer to simultaneously form X wiring lines and Y segmented wiring lines in a same plane, the Y segmented wiring lines intersecting with the X wiring lines, being severed by the X wiring lines at the intersections, and being distanced from the X wiring lines; a third step, after the second step, of oxidizing side surfaces of the X wiring lines to cover the side surfaces by an insulating metal oxide film; and a fourth step, after the third step, of depositing a conductive film layer so as to cover at least the intersections, whereby segments of each of the Y segmented wiring lines are electrically connected together, each of the Y segmented wiring lines being severed by and distanced from the X wiring lines.

In this fabrication method also, the third step of oxidizing the side surfaces of the X wiring lines may be carried out by anodic oxidation.

(2) A second aspect of the present invention (eighth to eighteenth embodiments) relates to a bottom-gate TFT array substrate to which the above-described electrical circuit board is applied, and includes the following.

There is provided a bottom-gate TFT array substrate comprising: gate electrodes formed directly on a substrate or with an undercoat film layer disposed between the gate electrodes and the substrate, side surfaces of the gate electrodes being covered with an insulating film; a gate insulating film stacked on each of the gate electrodes; a semiconductor film stacked on the gate insulating film, the semiconductor film having source regions, drain regions, and channel regions between the source regions and the drain regions; source contact electrodes stacked on the source regions of the semiconductor film; drain contact electrodes stacked on the drain regions of the semiconductor film; pixel electrodes connected to the drain regions of the semiconductor film by the drain contact electrodes; gate wiring lines connected to the gate electrodes, top and side surfaces of the gate wiring lines being covered with an insulating film; source segmented wiring lines formed in a same plane as the gate wiring lines, each of the source segmented wiring lines intersecting with the gate wiring lines in the same plane and being severed by and distanced from the gate wiring lines at the intersections; and source wiring line-connecting electrodes for electrically connecting segments of each source segmented wiring line together on the gate wiring lines.

With this construction, it is possible to provide a bottom-gate TFT array substrate with excellent reliability.

In this construction, the pixel electrodes and the source wiring line-connecting electrodes may be composed of a same transparent conductive film material.

Further, the substrate may be constructed such that a source segmented wiring line section pattern has a five-layered structure composed of the source segmented wiring lines, a gate insulating film, a semiconductor film, a contact metal film, and a transparent conductive film, and the source segmented wiring lines are located at the bottom of the five-layered structure; a gate wiring line section pattern has a five-layered structure composed of the gate wiring lines, a gate insulating film, a semiconductor film, a contact metal film, and a transparent conductive film, and the gate wiring lines are located at the bottom of the five-layered structure; and the source segmented wiring lines and the gate wiring lines are in the same plane on the substrate.

In addition, the insulating film of at least the side surfaces of the gate wiring lines may be composed of an oxide film formed from the conductive metal film.

Moreover, the oxide film may be an anodic oxide film formed by anodic oxidation.

The substrate may also be constructed such that the semiconductor film has a two-layered structure composed of an i-type amorphous silicon layer and an n-type amorphous silicon layer.

Furthermore, in place of the transparent conductive film material, a light reflective conductive film material may be used. Thereby, it is possible to construct a bottom-gate TFT array substrate for reflective devices.

The above-described bottom-gate TFT array substrate may be fabricated by the following fabrication method, with great productivity.

Specifically, the method comprising: (A) sequentially depositing at least a G-S metal film layer, a gate insulating film layer, a semiconductor film layer, and a contact metal film layer over a surface of an insulating substrate, the G-S metal film layer to be formed into gate electrodes, gate wiring lines, and source segmented wiring lines; (B), after step (A), by photolithography, using a first resist pattern, etching the layers through to the surface of the insulating substrate to form a gate electrode section pattern, a gate wiring line section pattern, and a source segmented wiring line section pattern, the gate electrode section pattern including gate electrodes and the gate metal film, the gate insulating film, the semiconductor film, and the contact metal film which are sequentially stacked on the gate electrodes, the gate wiring line section pattern including gate wiring lines connected to the gate electrodes and the gate metal film, the gate insulating film, the semiconductor film, and the contact metal film which are sequentially stacked on the gate wiring lines, and the source segmented wiring line section pattern including source segmented wiring lines, which are severed and distanced at the intersections of the source segmented wiring lines and the gate wiring lines, and the gate metal film, the gate insulating film, the semiconductor film, and the contact metal film which are sequentially stacked on the source segmented wiring lines; (C), after step (B), oxidizing side surfaces of the gate electrodes and side surfaces of the gate wiring lines to form an electrically insulating metal oxide film; (D), after step (C), depositing a transparent conductive film layer on top of the contact metal film over the entire surface of the substrate so that at least segments of each source segmented wiring line are electrically connected together by the conductive film; and (E), after step (D), by photolithography, using a second resist pattern, etching the transparent conductive film layer in a predetermined pattern to form pixel electrodes and etching the contact metal film of the gate electrode section pattern through to a surface of the semiconductor film to form channel regions on the semiconductor film.

In this fabrication method, the oxidation of the side surfaces of the gate electrodes and the side surfaces of the gate wiring lines may be carried out by anodic oxidation.

In addition, the semiconductor film layer may have a two-layered structure composed of an n-type amorphous silicon layer and an i-type amorphous silicon layer; and step (E) of etching the contact metal film of the gate electrode section pattern may be carried out such that part of the contact metal film and part of the n-type amorphous silicon layer immediately below the contact metal film are etched through to the i-type amorphous silicon layer.

Furthermore, in place of the transparent conductive film layer in step (D), a light reflective conductive film layer may be deposited.

(3) A third aspect of the present invention (nineteenth to twenty-third embodiments) relates to a liquid crystal display device utilizing a bottom-gate TFT array substrate, and includes the following.

There is provided a liquid crystal display device comprising; a bottom-gate TFT array substrate including gate electrodes formed directly on a substrate or with an undercoat film layer disposed between the gate electrodes and the substrate, side surfaces of the gate electrodes being covered with an insulating film; a gate insulating film stacked on the gate electrodes; a semiconductor film stacked on the gate insulating film, the semiconductor film having source regions, drain regions, and channel regions between the source regions and the drain regions; source contact electrodes stacked on the source regions of the semiconductor film; drain contact electrodes stacked on the drain regions of the semiconductor film; pixel electrodes connected to the drain regions of the semiconductor film by the drain contact electrodes; gate wiring lines connected to the gate electrodes, top and side surfaces of the gate wiring lines being covered with an insulating film; source segmented wiring lines formed in a same plane as the gate wiring lines, the source segmented wiring lines intersecting with the gate wiring lines in the same plane and being severed by and distanced from the gate wiring lines at the intersections; and source wiring line-connecting electrodes for electrically connecting segments of each source segmented wiring line together on the gate wiring lines; and a counter substrate; wherein the TFT array substrate and the counter substrate are opposed to each other with a surface on which the TFTs are being formed facing inside and with a predetermined gap therebetween, a liquid crystal being held in the gap.

It is possible to further add the following to this construction. Specifically, the construction may be such that a surface of the TFT array substrate is protected by a passivation film. In addition, the passivation film may be one selected from the group consisting of a silica film and a silicon nitride film.

Furthermore, the pixel electrodes may be composed of a transparent metal film.

Moreover, the pixel electrodes may be composed of a light reflective metal film.

(4) A fourth aspect of the present invention (twenty-fourth to thirtieth embodiments) relates to a bottom-gate TFT array substrate, and includes the following.

(Twenty-Fourth Embodiment)

There is provided a bottom-gate TFT array substrate comprising source segmented wiring lines, gate electrodes, gate wiring lines, a gate insulating film, a semiconductor film, and a reflective pixel metal electrode group, the bottom-gate TFT array substrate wherein: at least side surfaces of gate electrodes and side surfaces of the gate wiring lines are oxidized; each of the reflective pixel metal electrodes has a two-layered structure composed of a contact electrode metal and another metal electrode film and is connected to a drain region of a corresponding TFT by the contact electrode metal; and each of the source segmented wiring lines is connected to a source region of a corresponding TFT by two layers of a contact electrode metal and a metal electrode.

(Twenty-Fifth Embodiment)

The bottom-gate TFT array substrate according to the twenty-fourth embodiment may be such that the reflective pixel metal electrode group is one selected from the group consisting of aluminum and an aluminum-based alloy.

(Twenty-Sixth Embodiment)

The bottom-gate TFT array substrate according to the twenty-fourth embodiment may be such that part of each source segmented wiring line has a two-layered structure composed of a contact metal film and an aluminum-based metal electrode film.

(Twenty-Seventh Embodiment)

The bottom-gate TFT array substrate according to the twenty-fourth embodiment may be such that the gate insulating film and the semiconductor film are formed between the gate electrode metal and the contact electrode metal.

(Twenty-Eighth Embodiment)

The bottom-gate TFT array substrate according to the twenty-fourth embodiment may be such that the source segmented wiring lines are severed by the gate wiring lines, and segments of each source segmented wiring line are interconnected together on the gate wiring lines by the two layers of the contact electrode metal and the metal electrode.

(Twenty-Ninth Embodiment)

The bottom-gate TFT array substrate according to the twenty-fourth embodiment may be such that part of the semiconductor film has a two-layered structure composed of an i-type layer and an n+-type layer.

(Thirtieth Embodiment)

The bottom-gate TFT array substrate according to the twenty-fourth embodiment may be such that an undercoat film is formed between a surface of the insulating substrate and the gate wiring line metal film.

(5) A fifth aspect of the present invention (thirty-first to thirty-fifth embodiments) includes the following.

(Thirty-First Embodiment)

There is provided a method of fabricating a bottom-gate TFT array substrate comprising: forming at least a gate wiring line metal film, a gate insulating film, and a semiconductor film on a surface of an insulating substrate; by photolithography, sequentially etching the semiconductor film, the gate insulating film, and the gate wiring line metal film, using a first pattern; oxidizing side surfaces of portions of a gate wiring line metal film pattern to be formed into gate wiring lines and gate electrodes; forming a contact metal film and a metal electrode film; and by photolithography, etching part of the metal electrode film, the contact metal film, and the semiconductor film, using a second pattern.

(Thirty-Second Embodiment)

In the fabrication method according to the thirty-first embodiment, the metal electrode film may be an aluminum or aluminum-based alloy film.

(Thirty-Third Embodiment)

The fabrication method according to the thirty-first embodiment may further comprise forming a silica-based undercoat film between the surface of the insulating substrate and the gate wiring line metal film.

(Thirty-Fourth Embodiment)

In the fabrication method according to the thirty-first embodiment, at least an aluminum-based alloy film may be formed for the gate wiring line metal film.

(Thirty-Fifth Embodiment)

In the fabrication method according to the thirty-first embodiment, the oxidation may be carried out, by anodic oxidation, in a neutral solution.

(6) A sixth aspect of the present invention (thirty-sixth to thirty-eighth embodiments) includes the following.

(Thirty-Sixth Embodiment)

There is provided a liquid crystal display device comprising: a bottom-gate TFT array substrate having an array side, the array side including gate electrodes and gate wiring lines, at least side surfaces of the gate electrodes and side surfaces of the gate wiring lines being oxidized; reflective pixel metal electrodes each having a two-layered structure composed of a contact electrode metal and another metal electrode film and being connected to a drain region of a corresponding TFT by the contact electrode metal; and source segmented wiring lines each connected to a source region of a corresponding TFT by two layers of a contact electrode metal and a metal electrode; and a color filter substrate having a color filter side on which a counter transparent electrode is formed; wherein the bottom-gate TFT array substrate and the color filter substrate are adhered together with the array side and the color filter side opposing to each other and with a predetermined gap maintained between the substrates, a liquid crystal being sandwiched in the gap and an alignment film being disposed on each of the substrates.

(Thirty-Seventh Embodiment)

The liquid crystal display device according to the thirty-sixth embodiment may be such that at least part of the TFT array is covered with a passivation film.

(Thirty-Eighth Embodiment)

The liquid crystal display device according to the thirty-seventh embodiment may be such that the passivation film is an inorganic substance.

(7) A seventh aspect of the present invention (thirty-ninth to forty-first embodiments) includes the following.

(Thirty-Ninth Embodiment)

There is provided a method of fabricating a liquid crystal display device comprising: fabricating a first bottom-gate TFT array substrate including forming at least a gate wiring line metal film, a gate insulating film, and a semiconductor film on a surface of an insulating substrate; by photolithography, sequentially etching the semiconductor film, the gate insulating film, and the gate wiring line metal film, using a first pattern; oxidizing side surfaces of portions of a gate wiring line metal film pattern to be formed into gate wiring lines and gate electrodes; forming a contact metal film and a metal electrode film; and by photolithography, etching part of the metal electrode film, the contact metal film, and the semiconductor film, using a second pattern; forming an alignment film on the first substrate; forming an alignment film on a surface of a counter electrode side of a second color filter substrate having a counter transparent electrode formed thereon; adhering and fixing the first and second substrates at the periphery thereof such that the substrates are arranged with the two alignment films facing inside and with a predetermined gap maintained between the substrates; and injecting a specified liquid crystal between the first and second substrates.

(Fortieth Embodiment)

The fabrication method according to the thirty-ninth embodiment may further comprise, after the fabrication of the bottom-gate TFT array substrate prior to the formation of the alignment films, covering at least part of the TFT array by a passivation film.

(Forty-First Embodiment)

The fabrication method according to the thirty-ninth embodiment may be such that the metal electrode and the contact electrode metal are formed in a single layer with a same material.

(8) An eighth aspect of the present invention (forty-second to forty-eighth embodiments) includes the following.

(Forty-Second Embodiment)

There is provided a bottom-gate TFT array substrate comprising source segmented wiring lines, gate electrodes, gate wiring lines, a gate insulating film, a semiconductor film, and a comb-shaped pixel metal electrode group, the bottom-gate TFT array substrate wherein: at least side surfaces of gate electrodes, side surfaces of the gate wiring lines, and side surfaces of the first comb-shaped pixel electrodes are oxidized; each of the second comb-shaped pixel metal electrodes is connected to a drain region of a corresponding TFT by a contact electrode metal; and each of the source segmented wiring lines is connected to a source region of a corresponding TFT by a contact electrode metal and a metal electrode.

(Forty-Third Embodiment)

The bottom-gate TFT array substrate according to the forty-second embodiment may be such that the oxide film of the side surfaces of the gate electrodes and of the first comb-shaped pixel electrodes is an anodic oxide film.

(Forty-Fourth Embodiment)

The bottom-gate TFT array substrate according to the forty-second embodiment may be such that the first comb-shaped pixel electrodes and part of each source segmented wiring line have a five-layered structure composed of a gate wiring line metal film, a gate insulating film, a semiconductor film, a contact metal film layer, and a metal electrode film.

(Forty-Fifth Embodiment)

The bottom-gate TFT array substrate according to the forty-second embodiment may be such that the contact electrode metal is formed to connect each of the comb-shaped electrodes to the semiconductor film.

(Forty-Sixth Embodiment)

The bottom-gate TFT array substrate according to the forty-second embodiment may be such that the source segmented wiring lines are severed by the gate wiring lines and the first comb-shaped electrodes, and segments of each source segmented wiring line are interconnected together on the gate wiring lines and the first comb-shaped electrodes by a contact electrode metal and the metal electrode.

(Forty-Seventh Embodiment)

The bottom-gate TFT array substrate according to the forty-second embodiment may be such that part of the semiconductor film has a two-layered structure composed of an i-type layer and an n-type layer.

(Forty-Eighth Embodiment)

The bottom-gate TFT array substrate according to the forty-second embodiment may be such that an undercoat film is formed between a surface of the insulating substrate and a gate wiring line metal film.

(9) A ninth aspect of the present invention (forty-ninth to fifty-third embodiments) includes the following.

(Forty-Ninth Embodiment)

There is provided a method of fabricating a bottom-gate TFT array substrate comprising: forming at least a gate wiring line metal film, a gate insulating film, a semiconductor film, and a contact metal film layer on a surface of an insulating substrate; by photolithography, sequentially etching the contact metal film layer, the semiconductor film, the gate insulating film, and the gate wiring line metal film, using a first pattern; oxidizing side surfaces of portions of a metal film pattern to be formed into gate wiring lines, gate electrodes, and first comb-shaped pixel electrodes; forming a metal electrode film; and by photolithography, sequentially etching part of the metal electrode film, the contact metal film layer, and the semiconductor film, using a second pattern.

(Fiftieth Embodiment)

The fabrication method according to the forty-ninth embodiment may be such that portions to be formed into the gate wiring lines, the gate electrodes, and the first comb-shaped pixel electrodes are simultaneously etched.

(Fifty-First Embodiment)

The fabrication method according to the forty-ninth embodiment may further comprise forming an undercoat film between the surface of the insulating substrate and the gate wring line metal film.

(Fifty-Second Embodiment)

The fabrication method according to the forty-ninth embodiment may be such that at least the gate wiring line metal film, the gate insulating film, and the semiconductor film are sequentially formed.

(Fifty-Third Embodiment)

The fabrication method according to the forty-ninth embodiment may be such that the oxidation is carried out by anodic oxidation.

(10) A tenth aspect of the present invention (fifty-fourth to fifty-sixth embodiments) includes the following.

(Fifty-Fourth Embodiment)

There is provided a liquid crystal display device comprising: a bottom-gate TFT array substrate having an electrode side, the electrode side including gate electrodes, gate wiring lines, and first comb-shaped electrodes, at least side surfaces of the gate electrodes, of the gate wiring lines, and of the first comb-shaped electrodes being oxidized; second comb-shaped pixel metal electrodes each connected to a drain region of a corresponding TFT by a contact electrode metal; and source segmented wiring lines each connected to a source region of a corresponding TFT by a contact electrode; metal and a metal electrode; and a color filter substrate having a color filter side; wherein the bottom-gate TFT array substrate and the color filter substrate are adhered together with the electrode side and the color filter side opposing to each other and with a predetermined gap maintained between the substrates, a liquid crystal being sandwiched in the gap and an alignment film being disposed on each of the substrates.

(Fifty-Fifth Embodiment)

The liquid crystal display device according to the fifty-fourth embodiment may be such that at least part of the TFT array is covered with a passivation film.

(Fifty-Sixth Embodiment)

The liquid crystal display device according to the fifty-fifth embodiment may be such that the passivation film is an inorganic substance.

(11) An eleventh aspect of the present invention (fifty-seventh to fifty-ninth embodiments) includes the following.

(Fifty-Seventh Embodiment)

There is provided a method of fabricating a liquid crystal display device comprising: fabricating a first bottom-gate TFT array substrate including forming at least a gate wiring line metal film, a gate insulating film, a semiconductor film, and a contact metal film layer on a surface of an insulating substrate; by photolithography, sequentially etching the contact metal film layer, the semiconductor film, the gate insulating film, and the gate wiring line metal film, using a first pattern; oxidizing side surfaces of portions of a metal film pattern to be formed into gate wiring lines, gate electrodes, and first comb-shaped pixel electrodes; forming a metal electrode film; and by photolithography, sequentially etching part of the metal electrode film, the contact metal film layer, and the semiconductor film, using a second pattern; forming an alignment film on the first substrate; forming an alignment film on a surface of a second color filter substrate; adhering and fixing the first and second substrates at the periphery thereof such that the substrates are arranged with the two alignment films facing inside and with a predetermined gap maintained between the substrates; and injecting a specified liquid crystal between the first and second substrates.

(Fifty-Eighth Embodiment)

The fabrication method according to the fifty-seventh embodiment may further comprise, after the fabrication of the bottom-gate TFT array substrate prior to the formation of the alignment films, covering at least part of the TFT array by a passivation film; and using the passivation film as a mask, etching the metal electrode film, the contact metal film layer, the semiconductor film, and the gate insulating film, to expose gate wiring line terminals.

(Fifty-Ninth Embodiment)

The fabrication method according to the fifty-eighth embodiment may be such that the passivation film is a silica film or a silicon nitride film.

(12) A twelfth aspect of the present invention (sixtieth to sixty-sixth embodiments) includes the following.

(Sixtieth Embodiment)

There is provided a bottom-gate TFT array substrate comprising source segmented wiring lines, gate electrodes, gate wiring lines, a gate insulating film, a semiconductor film, and a comb-shaped pixel metal electrode group, the bottom-gate TFT array substrate wherein: at least side surfaces of gate electrodes and side surfaces of the gate wiring lines are oxidized; each of the comb-shaped reflective pixel metal electrodes has a two-layered structure composed of a contact electrode metal and another metal electrode film and is connected to a drain region of a corresponding TFT by the contact electrode metal; and each of the source segmented wiring lines is connected to a source region of a corresponding TFT by two layers of a contact electrode metal and a metal electrode.

(Sixty-First Embodiment)

The bottom-gate TFT array substrate according to the sixtieth embodiment may be such that an aluminum-based metal is used for the gate electrodes, and the insulating film of the side surfaces is an anodic oxide film.

(Sixty-Second Embodiment)

The bottom-gate TFT array substrate according to the sixtieth embodiment may be such that part of each source segmented wiring line has a five-layered structure composed of a gate wiring line metal film, a gate insulating film, a semiconductor film, a contact metal film layer, and a metal electrode film.

(Sixty-Third Embodiment)

The bottom-gate TFT array substrate according to the sixtieth embodiment may be such that the contact electrode metal is formed between a source electrode and the semiconductor film and between the comb-shaped electrode and the semiconductor film.

(Sixty-Fourth Embodiment)

The bottom-gate TFT array substrate according to the sixtieth embodiment may be such that the source segmented wiring lines are severed by the gate wiring lines, and segments of each source segmented wiring line are interconnected together on the gate wiring lines by the two layers of the contact electrode metal and the metal electrode.

(Sixty-Fifth Embodiment)

The bottom-gate TFT array substrate according to the sixtieth embodiment may be such that part of the semiconductor film has a two-layered structure composed of an i-type layer and an n-type layer.

(Sixty-Sixth Embodiment)

The bottom-gate TFT array substrate according to the sixtieth embodiment may be such that an undercoat film is formed between a surface of the insulating substrate and the gate wiring line metal film.

(13) A thirteenth aspect of the present invention (sixty-seventh to seventy-first embodiments) includes the following.

(Sixty-Seventh Embodiment)

There is provided a method of fabricating a bottom-gate TFT array substrate comprising: forming at least a gate wiring line metal film, a gate insulating film, and a semiconductor film on a surface of an insulating substrate; by photolithography, sequentially etching the semiconductor film, the gate insulating film, and the gate wiring line metal film, using a first pattern; oxidizing side surfaces of portions of a gate wiring line metal film pattern to be formed into gate wiring lines, gate electrodes, and first comb-shaped electrodes; forming a contact metal film layer and a metal electrode film; and by photolithography, etching part of the metal electrode film, the contact metal film layer, and the semiconductor film, using a second pattern.

(Sixty-Eighth Embodiment)

The fabrication method according to the sixty-seventh embodiment may be such that the semiconductor film has a two-layered structure composed of an i-type layer and an n-type layer, and part of the n-type layer is etched through to the i-type layer.

(Sixty-Ninth Embodiment)

The fabrication method according to the sixty-seventh embodiment may further comprise forming an undercoat film between the surface of the insulating substrate and the gate wiring line metal film.

(Seventy Embodiment)

The fabrication method according to the sixty-seventh embodiment may be such that at least the gate wiring line metal film, the gate insulating film, and the semiconductor film are sequentially formed.

(Seventy-First Embodiment)

The fabrication method according to the sixty-seventh embodiment may be such that the oxidation is carried out by anodic oxidation.

(14) A fourteenth aspect of the present invention (seventy-second to seventy-fourth embodiments) includes the following.

(Seventy-Second Embodiment)

There is provided a liquid crystal display device comprising: a bottom-gate TFT array substrate having an array side, the array side including gate electrodes and gate wiring lines, at least side surfaces of the gate electrodes and side surfaces of the gate wiring lines being oxidized; first comb-shaped pixel metal electrodes each having a two-layered structure composed of a contact electrode metal and another metal electrode film and being connected to a drain region of a corresponding TFT by the contact electrode metal; and source segmented wiring lines each connected to a source region of a corresponding TFT by two layers of a contact electrode metal and a metal electrode; and a color filter substrate having a color filter side; wherein the bottom-gate TFT array substrate and the color filter substrate are adhered together with the array side and the color filter side opposing to each other and with a predetermined gap maintained between the substrates, a liquid crystal being sandwiched in the gap and an alignment film being disposed on each of the substrates.

(Seventy-Third Embodiment)

The liquid crystal display device according to the seventy-second embodiment may be such that at least part of the TFT array is covered with a passivation film.

(Seventy-Fourth Embodiment)

The liquid crystal display device according to the seventy-second embodiment may be such that the passivation film is an inorganic substance.

(15) A fifteenth aspect of the present invention (seventy-fifth to seventy-seventh embodiments) includes the following.

(Seventy-Fifth Embodiment)

There is provided a method of fabricating a liquid crystal display device comprising: fabricating a first bottom-gate TFT array substrate including forming at least a gate wiring line metal film, a gate insulating film, and a semiconductor film on a surface of an insulating substrate; by photolithography, sequentially etching the semiconductor film, the gate insulating film, and the gate wiring line metal film, using a first pattern; oxidizing side surfaces of portions of a gate wiring line metal film pattern to be formed into gate wiring lines, gate; electrodes, and first comb-shaped electrodes; forming a contact metal film layer and a metal electrode film; by photolithography, etching part of the metal electrode film, the contact metal film layer, and the semiconductor film, using a second pattern; forming an alignment film on the first substrate; forming an alignment film on a surface of a counter electrode side of a second color filter substrate; adhering and fixing the first and second substrates and the color filter substrate at the periphery thereof such that the substrates are arranged with the two alignment films facing inside and with a predetermined gap maintained between the substrates; and injecting a specified liquid crystal between the first and second substrates.

(Seventy-Sixth Embodiment)

The fabrication method according to the seventy-fifth embodiment may further comprise, after the fabrication of the bottom-gate TFT array substrate prior to the formation of the alignment films, covering at least part of the TFT array by a passivation film.

(Seventy-Seventh Embodiment)

The fabrication method according to the seventy-fifth embodiment may be such that the metal electrode and the contact electrode metal are formed in a single layer with a same material.

(16) A sixteenth aspect of the present invention (seventy-eighth to eighty-fourth embodiments) includes the following.

(Seventy-Eighth Embodiment)

There is provided a bottom-gate TFT array substrate comprising source segmented wiring lines, gate electrodes, gate wiring lines, a gate insulating film, a semiconductor film, and a comb-shaped pixel electrode group, the bottom-gate TFT array substrate wherein: at least side surfaces of gate electrodes and side surfaces of the gate wiring lines are oxidized; each of the first comb-shaped pixel electrodes is connected to a drain region of a corresponding TFT by a contact electrode metal; each of the source segmented wiring lines is connected to a source region of a corresponding TFT by a contact electrode metal and a metal electrode; and the second comb-shaped pixel electrodes are formed with a passivation film disposed between the second comb-shaped pixel electrodes and the substrate.

(Seventy-Ninth Embodiment)

The bottom-gate TFT array substrate according to the seventy-eighth embodiment may be such that the oxide film of the side surfaces of the gate electrodes is an anodic oxide film.

(Eightieth Embodiment)

The bottom-gate TFT array substrate according to the seventy-eighth embodiment may be such that part of each source segmented wiring line has a five-layered structure composed of a gate wiring line metal film, a gate insulating film, a semiconductor film, a contact metal film layer, and a metal electrode film.

(Eighty-First Embodiment)

The bottom-gate TFT array substrate according to the seventy-eighth embodiment may be such that the contact electrode metal is formed between the semiconductor film and a source electrode and between the semiconductor film and a drain electrode.

(Eighty-Second Embodiment)

The bottom-gate AFT array substrate according to the seventy-eighth embodiment may be such that the source segmented wiring lines are severed by the gate wiring lines, and segments of each source segmented wiring line are interconnected together on the gate wiring lines by a contact electrode metal and the metal electrode.

(Eighty-Third Embodiment)

The bottom-gate TFT array substrate according to the seventy-eighth embodiment may be such that part of the semiconductor film has a two-layered structure composed of an i-type layer and an n-type layer.

(Eighty-Fourth Embodiment)

The bottom-gate TFT array substrate according to the seventy-eighth embodiment may be such that an undercoat film is formed between a surface of the insulating substrate and the gate wiring line metal film.

(17) A seventeenth aspect of the present invention (eighty-fifth to eighty-ninth embodiments) includes the following.

(Eighty-Fifth Embodiment)

There is provided a method of fabricating a bottom-gate TFT array substrate comprising: forming at least a gate wiring line metal film, a gate insulating film, a semiconductor film, and a contact metal film layer on a surface of an insulating substrate; by photolithography, sequentially etching the contact metal film layer, the semiconductor film, the gate insulating film, and the gate wiring line metal film, using a first pattern; oxidizing side surfaces of portions of a metal film pattern to be formed into gate wiring lines and gate electrodes; forming a metal electrode film; by photolithography, sequentially etching part of the metal electrode film, the contact metal film layer, and the semiconductor film, using a second pattern; and forming second comb-shaped pixel electrodes using a third pattern with a passivation film disposed between the second comb-shaped pixel electrodes and the substrate.

(Eighty-Sixth Embodiment)

The fabrication method according to the eighty-fifth embodiment may be such that the semiconductor film has a two-layered structure composed of an i-type layer and an n-type layer, and part of the n-type layer is etched.

(Eighty-Seventh Embodiment)

The fabrication method according to the eighty-fifth embodiment may further comprise forming an undercoat film between the surface of the insulating substrate and the gate wiring line metal film.

(Eighty-Eighth Embodiment)

The fabrication method according to the eighty-fifth embodiment may be such that at least the gate wiring line metal film, the gate insulating film, and the semiconductor film are sequentially formed.

(Eighty-Ninth Embodiment)

The fabrication method according to the eighty-fifth embodiment may be such that the oxidation is carried out by anodic oxidation.

(18) An eighteenth aspect of the present invention (ninetieth to ninety-second embodiments) includes the following.

(Embodiment Ninetieth)

There is provided a liquid crystal display device comprising: a bottom-gate TFT array substrate having an electrode side, the electrode side including gate electrodes and gate wiring lines, at least side surfaces of the gate electrodes and side surfaces of the gate wiring lines being oxidized; first comb-shaped pixel metal electrodes each connected to a drain region of a corresponding TFT by a contact electrode metal; source segmented wiring lines each connected to a source region of a corresponding TFT by a contact electrode metal and a metal electrode; and second comb-shaped pixel electrodes formed with a passivation film disposed between the second comb-shaped pixel electrodes and the substrate; and a color filter substrate having a color filter side; wherein the bottom-gate TFT array substrate and the color filter substrate are adhered together with the electrode side and the color filter side opposing to each other and with a predetermined gap maintained between the substrates, a liquid crystal being sandwiched in the gap and an alignment film being disposed on each of the substrates.

(Ninety-First Embodiment)

The liquid crystal display device according to the ninetieth embodiment may be such that at least part of the TFT array is covered with a passivation film.

(Ninety-Second Embodiment)

The liquid crystal display device according to the ninety-first embodiment may be such that the passivation film is an inorganic substance.

(19) A nineteenth aspect of the present invention (ninety-third to ninety-fifth embodiments) includes the following.

(Ninety-Third Embodiment)

There is provided a method of fabricating a liquid crystal display device comprising: fabricating a first bottom-gate TFT array substrate including forming at least a gate wiring line metal film, a gate insulating film, a semiconductor film, and a contact metal film layer on a surface of an insulating substrate; by photolithography, sequentially etching the contact metal film layer, the semiconductor film, the gate insulating film, and the gate wiring line metal film, using a first pattern; oxidizing side surfaces of portions of a metal film pattern to be formed into gate wiring lines and gate electrodes; forming a metal electrode film; by photolithography, sequentially etching part of the metal electrode film, the contact metal film layer, and the semiconductor film, using a second pattern; and forming second comb-shaped pixel electrodes, using a third pattern, with a passivation film disposed between the second comb-shaped pixel electrodes and the substrate; forming an alignment film on the first substrate; forming an alignment film on a surface of a color filter side of a second color filter substrate; adhering and fixing the first and second substrates at the periphery thereof such that the substrates are arranged with the two alignment films facing inside and with a predetermined gap maintained between the substrates; and injecting a specified liquid crystal between the first and second substrates.

(Ninety-Fourth Embodiment)

The fabrication method according to the ninety-third embodiment may further comprise, after the formation of the second comb-shaped pixel electrodes, covering at least part of each second comb-shaped pixel electrode by a passivation film.

(Ninety-fifth embodiment)

The fabrication method according to the ninety-third embodiment may be such that the passivation film is a silica film or a silicon nitride film.

(20) A twentieth aspect of the present invention (ninety-sixth and ninety-seventh embodiments) includes the following.

(Ninety-Sixth Embodiment)

There is provided a bottom-gate TFT array substrate comprising source segmented wiring lines, gate electrodes, gate wiring lines, a gate insulating film, a semiconductor film, and a comb-shaped pixel electrode group, the bottom-gate TFT array substrate wherein: at least side surfaces of gate electrodes and side surfaces of the gate wiring lines are oxidized; each of the first comb-shaped pixel metal electrodes has a two-layered structure composed of a contact electrode metal and another metal electrode film and is connected to a drain region of a corresponding TFT by the contact electrode metal; each of the source segmented wiring lines is connected to a source region of a corresponding TFT by a contact electrode metal and a metal electrode; and the second comb-shaped pixel electrodes are formed with a passivation film disposed between the second-comb shaped pixel electrodes and the substrate.

(Ninety-Seventh Embodiment)

The bottom-gate TFT array substrate according to the ninety-sixth embodiment may be such that at least segments of each source segmented wiring line are connected together by a two-layered structure composed of the metal electrode and a contact electrode metal.

(21) A twenty-first aspect of the present invention (ninety-eighth embodiment) includes the following.

(Ninety-Eighth Embodiment)

There is provided a method of fabricating a bottom-gate TFT array substrate comprising: forming at least a gate wiring line metal film, a gate insulating film, and a semiconductor film on a surface of an insulating substrate; by photolithography, sequentially etching the semiconductor film, the gate insulating film, and the gate wiring line metal film, using a first pattern; oxidizing side surfaces of portions of a metal film pattern to be formed into gate wiring lines and gate electrodes; forming a contact metal film layer and a metal electrode film; by photolithography, sequentially etching part of the metal electrode film, the contact metal film layer, and the semiconductor film, using a second pattern; and forming second comb-shaped pixel electrodes, using a third pattern, with a passivation film disposed between the second comb-shaped pixel electrodes and the substrate.

(22) A twenty-second aspect of the present invention (ninety-ninth embodiment) includes the following.

(Ninety-Ninth Embodiment)

There is provided a liquid crystal display device comprising: a bottom-gate TFT array substrate having an electrode side, the electrode side including gate electrodes and gate wiring lines, at least side surfaces of the gate electrodes and side surfaces of the gate wiring lines being oxidized; first comb-shaped pixel electrodes each having a two-layered structure composed of a contact electrode metal and another metal electrode film and being connected to a drain region of a corresponding TFT by the contact electrode metal; source segmented wiring lines each connected to a source region of a corresponding TFT by a contact electrode metal and a metal electrode; and second comb-shaped pixel electrodes formed with a passivation film disposed between the second comb-shaped pixel electrodes and the substrate; and a color filter substrate having a color filter side; wherein the bottom-gate TFT array substrate and the color filter substrate are adhered together with the electrode side and the color filter side opposing to each other and with a predetermined gap maintained between the substrates, a liquid crystal being sandwiched in the gap and an alignment film being disposed on each of the substrates.

(23) A twenty-third aspect of the present invention (hundredth and hundred-first embodiments) includes the following.

(Hundredth Embodiment)

There is provided a method of fabricating a liquid crystal display device comprising: fabricating a first bottom-gate TFT array substrate including forming at least a gate wiring line metal film, a gate insulating film, and a semiconductor film on a surface of an insulating substrate; by photolithography, sequentially etching the semiconductor film, the gate insulating film, and the gate wiring line metal film, using a first pattern; oxidizing side surfaces of portions of a metal film pattern to be formed into gate wiring lines and gate electrodes; forming a contact metal film layer and a metal electrode film; by photolithography, sequentially etching part of the metal electrode film, the contact metal film layer, and the semiconductor film, using a second pattern; and forming second comb-shaped pixel electrodes, using a third pattern, with a passivation film disposed between the second comb-shaped pixel electrodes and the substrate; forming an alignment film on the first substrate; forming an alignment film on a surface of a color filter side of a second color filter substrate; adhering and fixing the first and second substrates at the periphery thereof such that the substrates are arranged with the two alignment films facing inside and with a predetermined gap maintained between the substrates; and injecting a specified liquid crystal between the first and second substrates.

(Hundred-First Embodiment)

The fabrication method may further comprise covering at least part of each second comb-shaped pixel electrode by a passivation film.

BEST MODE FOR CARRYING OUT THE INVENTION

The present invention is described in more detail below with reference to examples thereof.

EXAMPLE 1—1

Figure 1:
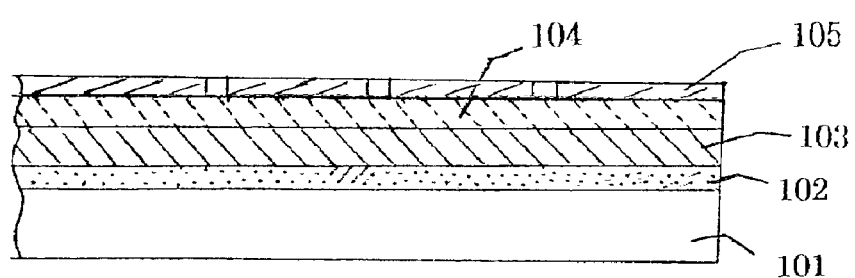
FIG. 1 is a schematic cross-sectional view illustrating a process step for fabricating an electrical circuit board in accordance with Example 1—1 of the present invention.

A transparent glass substrate (insulating substrate) 101 that had been thoroughly cleaned in advance was prepared, and a silica ($SiO_2$) film layer, serving as an undercoat film layer 102, was deposited by CVD to a thickness of 0.4 microns. Subsequently, an Al—Zr (97:3) alloy film layer, serving as a metal film layer 103 for forming X wiring lines and Y segmented wiring lines, was vapor deposited by sputtering to a film thickness of about 200 nm. Further, a $SiN_x$ film, serving as an insulating film layer 104, was deposited by plasma enhanced CVD to 150 nm (FIG. 1).

Figure 2:
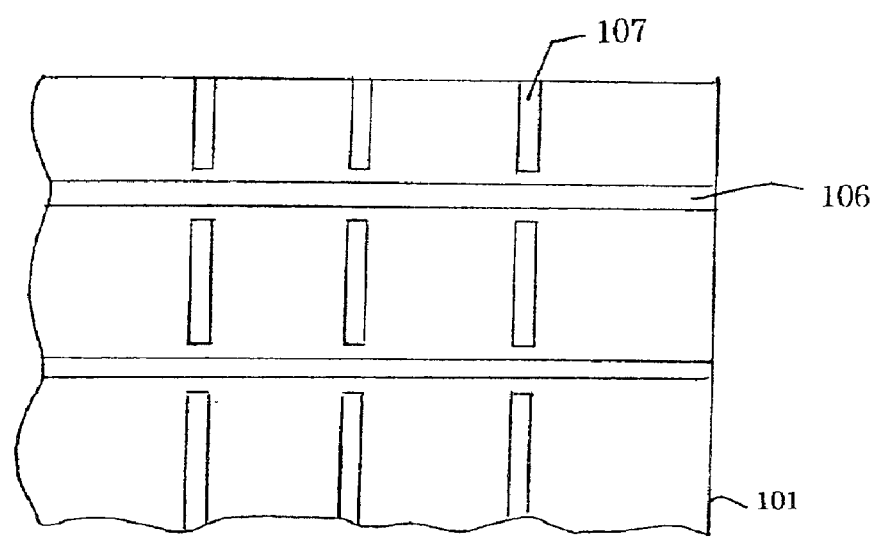
FIG. 2 is a plan view showing the state of the substrate surface that has been etched using a first resist pattern in accordance with Example 1—1 of the present invention.

Next, by photolithography using a first resist pattern 105 (FIG. 1), the layers were etched from the top of the insulating film layer 104 through to the undercoat film layer 102, to form X wiring lines 106 and Y segmented wiring lines 107 in a pattern on the substrate, the Y segmented wiring lines being severed by the X wiring lines at the intersections of the X wiring lines and the Y segmented wiring lines and being spaced apart from the X wiring lines (FIG. 2).

Then, by immersing the entire substrate in an electrolyte using ammonium borate and having a pH of about 7 and passing an electric current only through the X wiring lines from the periphery of the substrate (anodic oxidation), the side surfaces of the X wiring lines were oxidized, thus forming insulating metal oxide films 106' (mainly composed of $Al_2O_3$) on the side surfaces of the X wiring lines.

Figure 3:
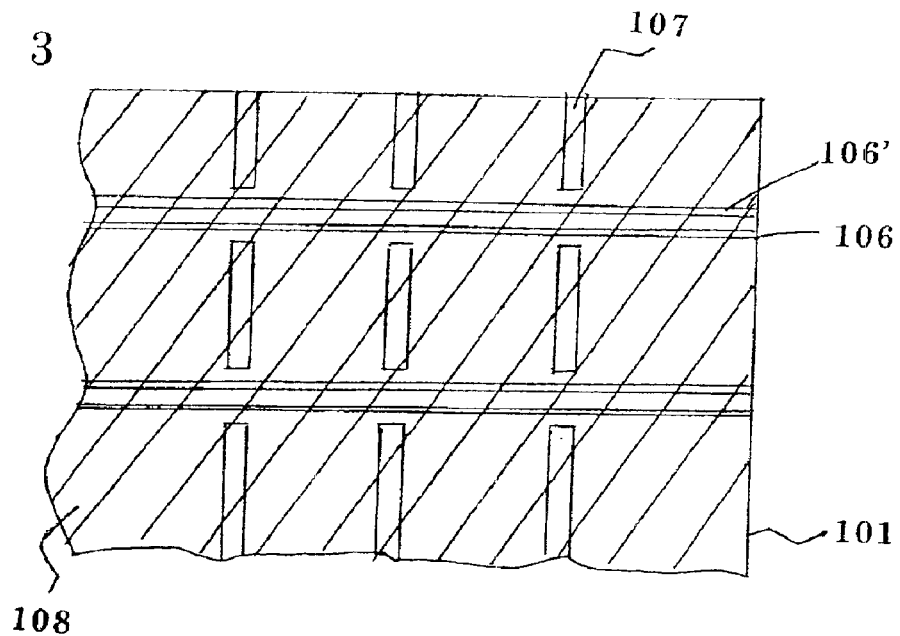
FIG. 3 is a plan view showing the state where a conductive film layer is deposited on the entire surface of the substrate in accordance with Example 1—1 of the present invention.
Figure 4:
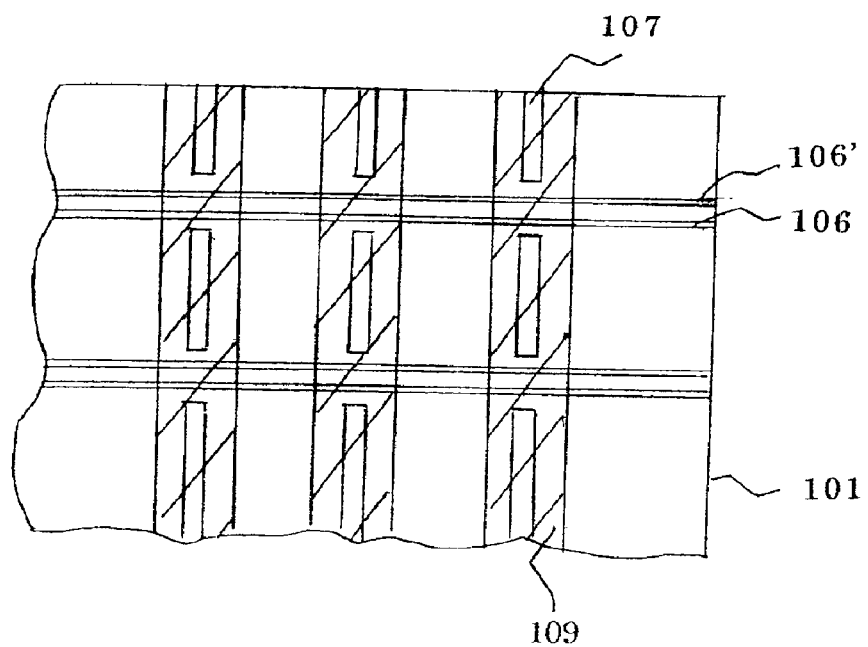
FIG. 4 is a plan view showing the state where the conductive film layer on the substrate has been processed into a predetermined pattern (Y segmented wiring line-connecting electrodes) in accordance with Example 1—1 of the present invention.

Subsequently, a conductive film layer 108 composed of, for example, indium tin oxide (ITO) was deposited on top of the insulating film layer 104 over the entire surface of the substrate so as to fill the space between the X wiring lines and the Y segmented wiring lines (FIG. 3). Thereafter, unwanted areas of the conductive film on the insulating film were etched using a second resist pattern, as is shown in FIG. 4, to form Y segmented wiring line-connecting electrodes 109; As a result of this etching, electrical conduction between adjacent Y segmented wiring lines arranged parallel to one another is prevented and electrical conduction (connection) between segments of each Y segmented wiring line severed by the X wiring lines at the intersections of the X wiring lines and the Y segmented wiring lines is able to be realized by the Y segmented wiring line-connecting electrode 109, thus completing an electrical circuit board in accordance with Example 1—1 having such a structure.

EXAMPLE 1-2

In Example 1-2, an insulating film layer 104 was not deposited. By using the above-described first resist pattern 105, a metal film layer 103 was etched to an undercoat film layer 102, thus forming X wiring lines and Y segmented wiring lines with no insulating films stacked thereon.

Subsequently, in a manner similar to that described in foregoing Example 1—1, the X wiring lines were oxidized by anodic oxidation to cover the side surfaces and top surfaces thereof by oxide films, mainly composed of $Al_2O_3$. It should be noted that in Example 1-2 both the top and side surfaces of the X wiring lines were oxidized in a manner similar to that described in the foregoing Example 1—1 because the metal film layer 103 was not covered by the insulating film layer 104 as was the case with Example 1—1.

Next, a conductive film layer (for example, ITO, Al, or the like) was deposited on the entire surface of the substrate, and then using a second resist pattern, unwanted areas of the conductive film layer were etched away in a manner similar to that described in Example 1—1. Thereby, an electrical circuit board in accordance with Example 1-2 was completed in which there is no connection between adjacent Y segmented wiring lines arranged parallel to one another and in which segments of each Y segmented wiring line severed at the intersections of the X wiring lines and the Y segmented wiring lines are connected together by the conductive film.

It should be noted that in Examples 1—1 and 1-2 the surface of the metal film was oxidized by anodic oxidation because this method allows insulating films, formed from the metal oxide film, to be selectively formed only on the X wiring lines, providing superior productivity.

It should also be understood that in the foregoing FIG. 4, the connecting electrodes were formed in a belt shape lying along the Y segmented wiring lines, but the shape is not limited thereto. For example, the shape of the second resist pattern may be changed so as to form a square- or circle-shaped connecting electrode pattern that covers only the intersections of the X wiring lines and the Y segmented wiring lines.

EXAMPLE 2-1

Figure 5:
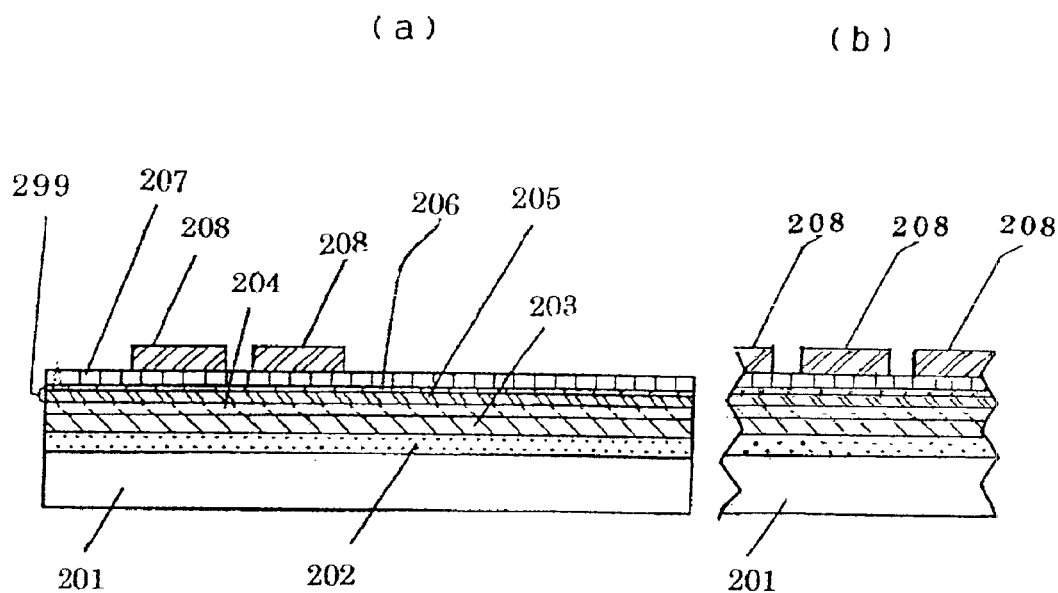
FIGS. 5(a) and 5(b) are schematic cross-sectional views illustrating a process step for fabricating a TFT array in accordance with Example 2-1 of the present invention.

A transparent glass substrate (insulating substrate) 201 that had been thoroughly cleaned in advance was prepared, and a silica ($SiO_2$) film, serving as an undercoat film layer 202, was deposited by CVD to a thickness of 0.4 microns. Subsequently, an Al—Zr (97:3) alloy film, serving as a G-S metal film layer 203 for gate electrodes, gate wiring lines, and source segmented wiring lines, was vapor deposited by sputtering to a film thickness of about 200 nm. Thereafter, a SiN$_x$ film, serving as a gate insulating film layer 204, was deposited by plasma enhanced CVD to 150 nm. Then, as a semiconductor film layer 299, an amorphous silicon i-type a-Si) film 205 not containing impurities and an amorphous silicon (n+a-Si) film 206 containing an n-type impurity were sequentially deposited to 50 nm and 50 nm, respectively. Finally, a 15 metal film, serving as a contact metal film layer 207, was vapor deposited by sputtering to a film thickness of about 100 nm, and a first resist pattern 208 for the first photolithography was then formed by a conventional method FIGS. 5(a) and 5(b)).

Figure 6:
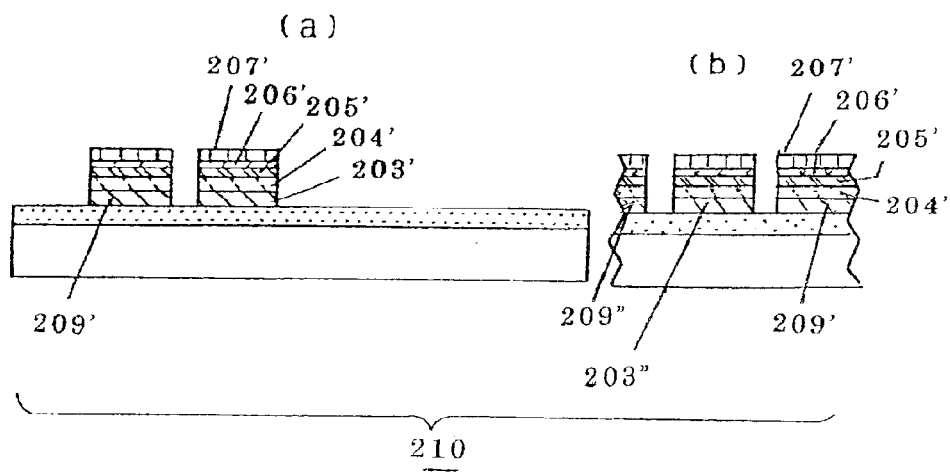
FIGS. 6(a) and 6(b) are schematic cross-sectional views illustrating a process step for fabricating the TFT array in accordance with Example 2-1 of the present invention.

Thereafter, the contact metal film layer 207 (Ti metal film), the n+a-Si film layer 206, the i-type a-Si film layer 205, the gate insulating film layer 204 (SiN$_x$ film), and the G-S metal film layer 203 (Al—Zr film) were sequentially etched, thereby forming a first pattern 210 including a gate electrode 203' or a gate wiring line 203", source segmented wiring lines 209' and 209", a gate insulating film 204', the semiconductor film 299 (205' and 206'), and a contact metal film 207' which were stacked (FIGS. 6(a) and 6(b)).

Figure 7:
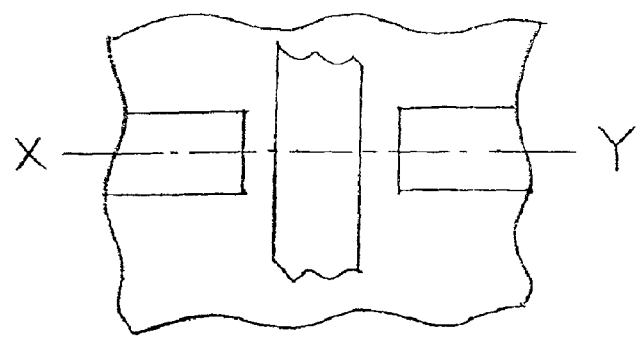
FIG. 7 is a schematic top plan view of FIG. 6(b).

A schematic top plan view of FIG. 6(b) is shown in FIG. 7. As can be seen from FIG. 7, the gate wiring line 203" extends from the front to the end as viewed in the figure, and the source segmented wiring lines 209' and 209" extend in the direction orthogonal to the 203" (the horizontal direction as viewed in the figure). The source segmented wiring lines 209' and 209" are disconnected by the gate wiring line 203" crossing therebetween, and the gate wiring line 203" is spaced apart from each of the source segmented wiring lines 209' and 209" by a predetermined distance. It is preferable that the distance of the space be made approximately equal to the total thickness of all the layers (etching depth).

It should be noted that FIG. 6(b) is a cross-sectional view taken along the line X-Y of FIG. 7.

Figure 8:
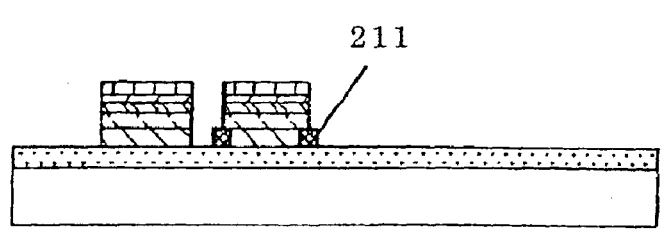
FIGS. 8(a) and 8(b) are schematic cross-sectional views illustrating a process step for fabricating the TFT array in accordance with Example 2-1 of the present invention.
Figure 8:
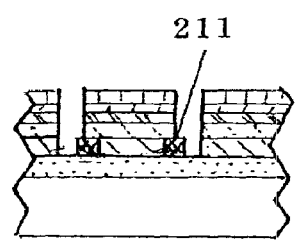

Next, the gate electrode 203' and the gate wiring line 203" were selectively anodically oxidized in an electrolyte using ammonium borate and having a pH of about 7, to form insulating films 211, mainly composed of Al$_2$O$_3$, on the side surfaces of the pattern (FIGS. 8(a) and 8(b)).

Figure 9:
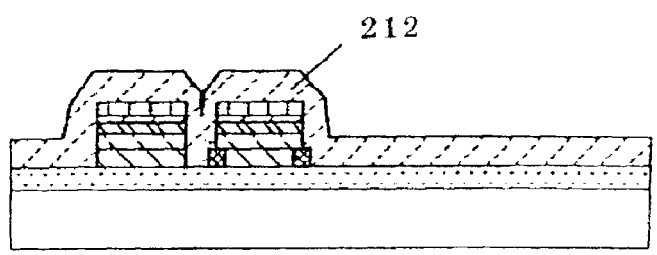
FIGS. 9(a) and 9(b) are schematic cross-sectional views illustrating a process step for fabricating the TFT array in accordance with Example 2-1 of the present invention.
Figure 9:
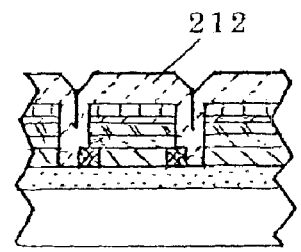

Thereafter, a transparent conductive film 212, composed of an indium tin oxide (ITO) film, was vapor deposited by sputtering on the entire surface of the substrate to a film thickness of about 100 nm (FIGS. 9(a) and 9(b)). The transparent conductive film 212 is to be connected to source regions and to pixel transparent electrodes 215, which are connected to drain regions, and also to connect together segments of each disconnected source segmented wiring line (i.e., serving as a source segmented wiring line-connecting electrode).

Figure 10:
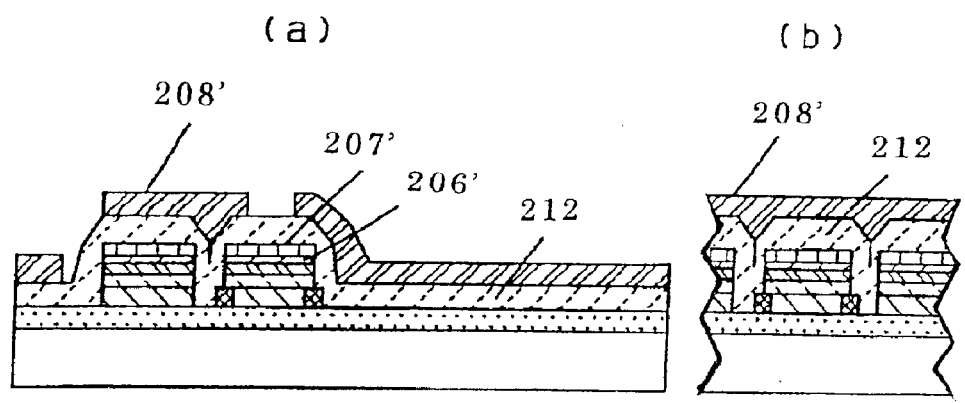
FIGS. 10(a) and 10(b) are schematic cross-sectional views illustrating a process step for fabricating the TFT array in accordance with Example 2-1 of the present invention
Figure 11:
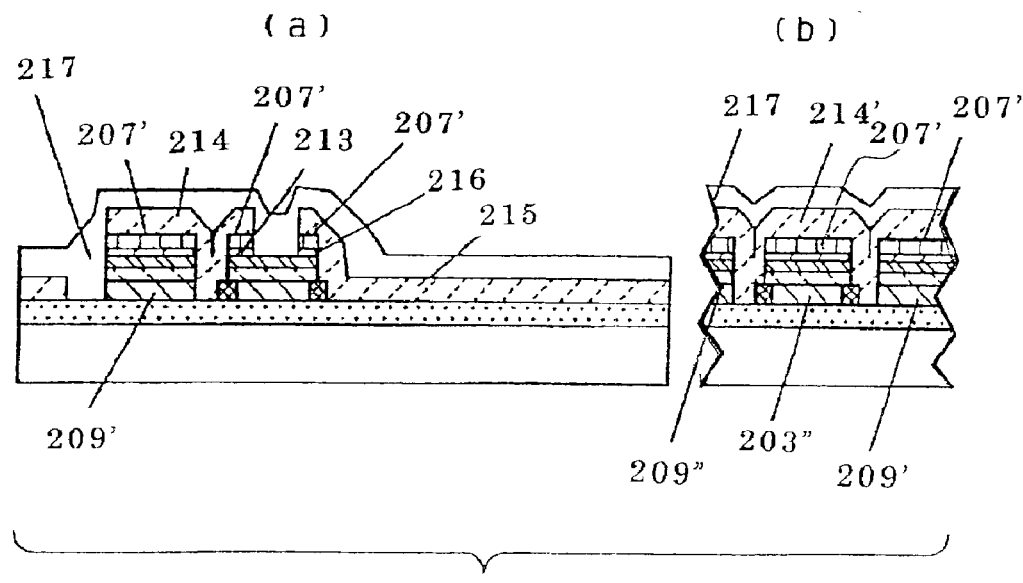
FIGS. 11(a) and 11(b) are schematic cross-sectional views illustrating a process step for fabricating the TFT array in accordance with Example 2-1 of the present invention.

Subsequently, a second resist pattern 208' for the second photolithography (FIGS. 10(a) and 10(b)) was formed by a conventional method. Then, part of the transparent conductive film 212, the contact metal film 207', and the n+a-Si film 206' on the gate electrode were sequentially etched away through to the i-type a-Si film 205', thus forming channel regions. The source segmented wiring line 209' was connected to a source region 213 by a portion of the contact electrode 207' and a transparent conductive film 214, and the pixel transparent electrode 215 was connected to a drain region 216 by a portion of the contact electrode 207' (FIGS. 11(a) and 11(b)).

Thus, the disconnected source segmented wiring lines 209' and 209" are connected together by a transparent conductive film 214' and a portion of the contact metal film 207' on the gate wiring line 203" (FIGS. 11(a) and 11(b)).

Figure 26:
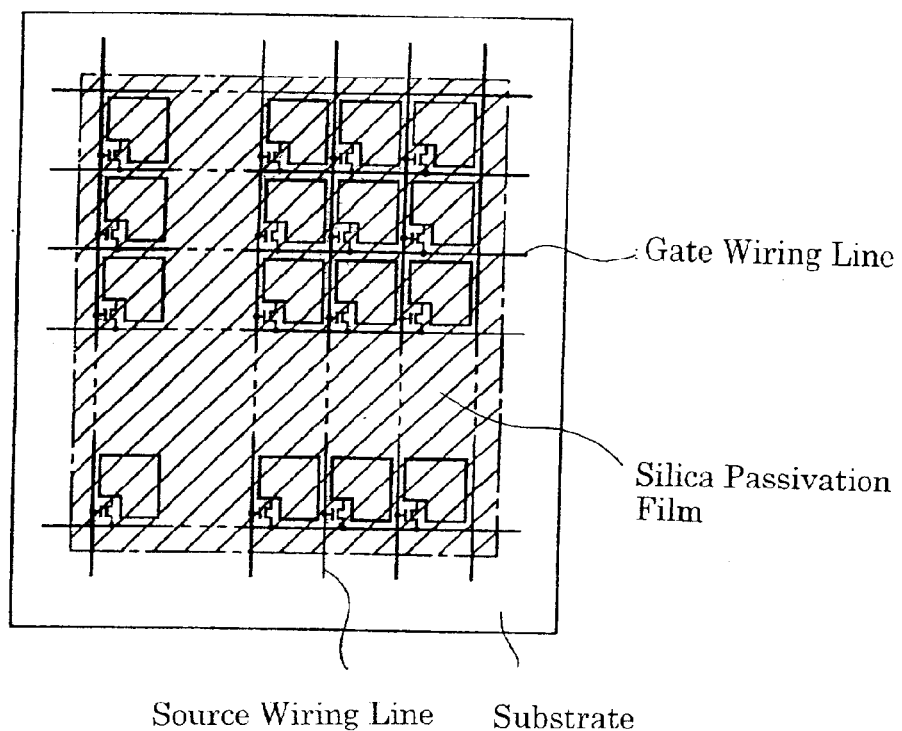
FIG. 26 is a view showing the entire TFT array substrate in accordance with Example 2-1 of the present invention.

Finally, by using printing and baking a silica passivation film layer 217 of 300 nm was formed on the substrate, except for the periphery thereof, so as to cover the TFTs. Thereafter, using this silica passivation film pattern as a mask, the peripheral portion of the stacked layers of the i-type a-Si film 205 and the gate insulating film layer 204 (SiN$_x$ film), which is to be connected to external driving circuitry, was etched away to expose the gate G-S metal film 203 (see FIG. 11). Thereby, a TFT array substrate 218 (FIG. 26) applicable to transmissive liquid crystal display devices was produced.

Figure 12:
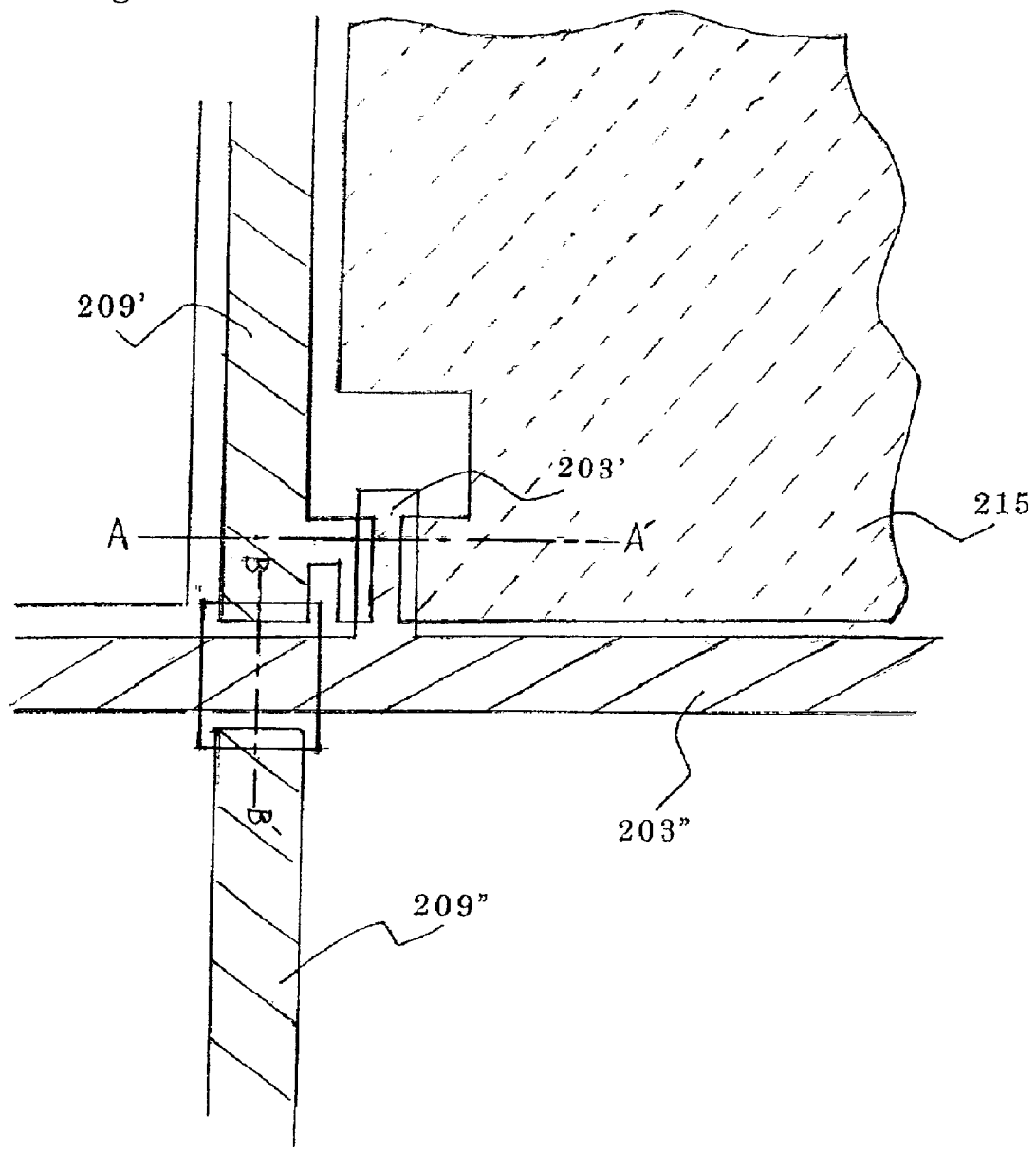
FIG. 12 is a schematic plan view of the TFT array substrate in accordance with Example 2-1.

FIG. 12 is an enlarged schematic plan view of a main portion of the TFT array substrate 218 produced in the present example. FIG. 11(a) is a cross-sectional view taken along the line A-A' of FIG. 12, and FIG. 11(b) is a cross-sectional view taken along the line B-B' of FIG. 12.

According to the present example described above, the gate wiring lines and the source segmented wiring lines are formed simultaneously in the same plane, and the side surfaces of the gate wiring lines are selectively oxidized by anodic oxidation for insulation. Segments of each source segmented wiring line, which has been disconnected by the gate wiring lines, are connected together by the contact metal film and the transparent conductive film that are stacked on each gate wiring line. Hence, the resistance of the source segmented wiring line is unlikely to increase substantially. In addition, with this structure, level differences on the surface of the TFT array can be sufficiently minimized.

Further, in fabricating a TFT array substrate, conventional methods required five to seven photomasks; on the other hand, the fabrication method of the present example requires only two photomasks. Therefore, according to the method of the present example, it is possible to significantly reduce the fabrication costs of a TFT array substrate.

Moreover, for stacking layers on the substrate, by sequentially depositing the G-S metal film layer, the gate insulating film layer, and the semiconductor film layer, it is possible to fabricate a highly reliable bottom-gate TFT array substrate with little contamination at the interfaces of the channel portions.

For oxidation, by carrying out anodic oxidation using an electrolyte with a pH of 7, it is possible to efficiently and selectively oxidize only the side surfaces of the gate electrodes and the side surfaces of the gate wiring lines connected to the gate electrodes. In addition, this method allows for formation of high quality oxide films with no pinholes, thus achieving wiring lines with little gate leakage.

In this example, the source segmented wiring lines have a five-layered structure composed of the G-S metal film, a gate insulating film, the semiconductor film, the contact metal film, and the conductive film, and therefore the overall resistance of the source segmented wiring lines is reduced.

In addition, in this example, the gate insulting film and the semiconductor film are deposited between the G-S metal film (the gate electrodes, gate wiring lines, and source segmented wiring lines) and the contact metal film (contact electrodes), and therefore current leakage is less likely to occur.

Furthermore, in this example, the semiconductor film has a two-layered structure composed of an i-type layer and an n-type layer, whereby the contact resistance of the source and the drain can be reduced.

Since the undercoat film layer is disposed between the surface of the insulating substrate and the gate wiring line metal film, diffusion of impurities from the substrate can be prevented.

In the present example, a TFT array substrate for a transmissive device was produced; but it is also possible to produce a TFT array substrate for a reflective device, i.e., applicable to reflective liquid crystal display devices, by using a high-reflective metal film such as Al or an Al alloy in place of the transparent conductive film.

EXAMPLE 2-2

Figure 13:
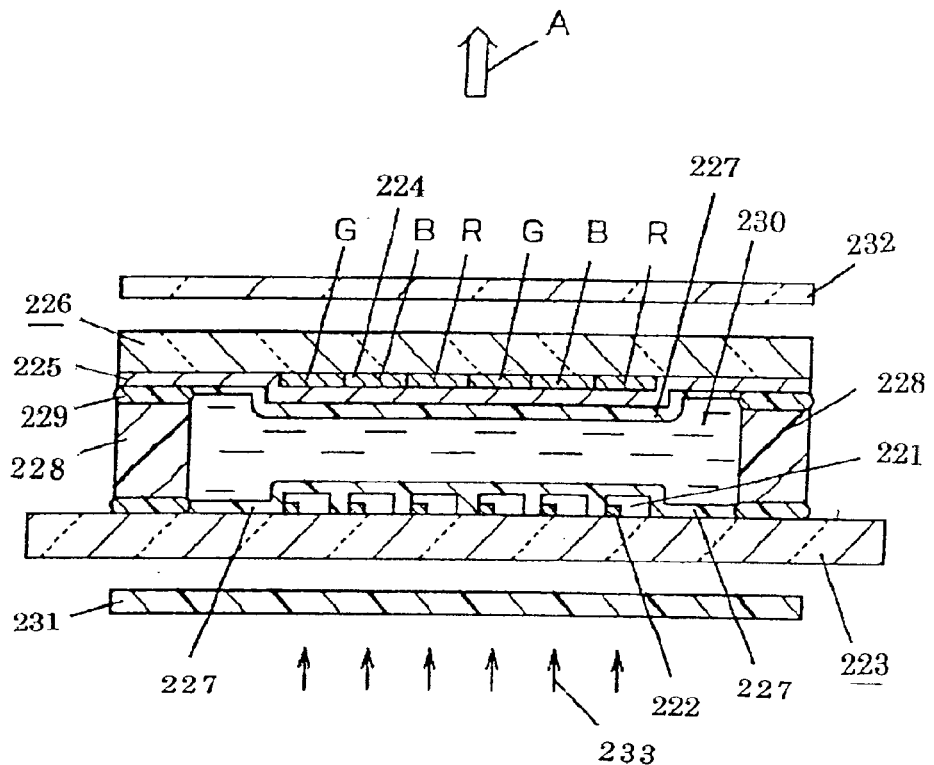
FIG. 13 is a schematic cross-sectional view illustrating a liquid crystal display device in accordance with Example 2—2 of the present invention.

The actual fabrication process of a liquid crystal display device using the TFT array substrate produced in the foregoing Example 2-1 is described with reference to FIG. 13.

First, there were provided a TFT array substrate, similar to that of Example 2-1, fabricated using two masks, more specifically, a first TFT array substrate 223 including a first electrode group 221 arranged in a matrix and a transistor group 222 that drives the first electrodes; and a second color filter substrate 226 including a second electrode 225 and a color filter group 224 placed opposite to the first electrode group. Over each of the substrates, by a conventional method, a polyimide resin was applied and cured, and the resulting films were subjected to rubbing, thus producing liquid crystal alignment films 227.

Next, the first and second substrates 223 and 226 were arranged such that their respective electrodes oppose one another, thus producing a cell having an alignment direction twisted 90 degrees and a gap of about 5 microns, created by spacers 228 and adhesives 229. Thereafter, a TN liquid crystal 230 was injected between the first and second substrates, and polarizers 231 and 232 were then arranged so as to have a crossed Nicols relation, thus completing a display device.

Such a device was capable of displaying images in the direction of the arrow A, by driving each transistor using video signals while lighting the entire display using a backlight 233. Here, after the step of fabricating the bottom-gate TFT array substrate prior to the formation of the alignment films, by carrying out the step of covering at least part of the TFT array by a passivation film, it was possible to fabricate a liquid crystal display device with high reliability.

In addition, for the passivation film, using a silica film or a silicon nitride film, which is an inorganic substance, made it possible to fabricate a liquid crystal display device with even higher reliability.

Furthermore, by using such a TFT array substrate as to have a metal electrode film formed in place of the transparent conductive film, it was possible to fabricate a reflective liquid crystal display device.

EXAMPLE 2-3

In a manner similar to that described in Example 2-1, a transparent glass substrate 201 that had been thoroughly cleaned was prepared, and a silica ($SiO_2$) film, serving as an undercoat film layer 202, was deposited by CVD to 0.4 microns. Then, an Al—Zr (97:3) alloy film, serving as a G-S metal film layer 203 for gate electrodes, gate wiring lines, and source segmented wiring lines, was vapor deposited by sputtering to a film thickness of about 200 nm. Subsequently, a $SiN_x$ film, serving as a gate insulating film layer 204, was deposited by plasma enhanced CVD to 150 nm, followed by, as a semiconductor film, an amorphous silicon (i-type a-Si) film layer 205 not containing impurities and an amorphous silicon (n+a-Si) film layer 206 containing an n-type impurity to 200 nm and 50 nm, respectively.

It should be noted that in this example a contact metal film is not deposited on the n+a-Si film layer 206, which is different from the foregoing.

EXAMPLE 2-1

Figure 14:
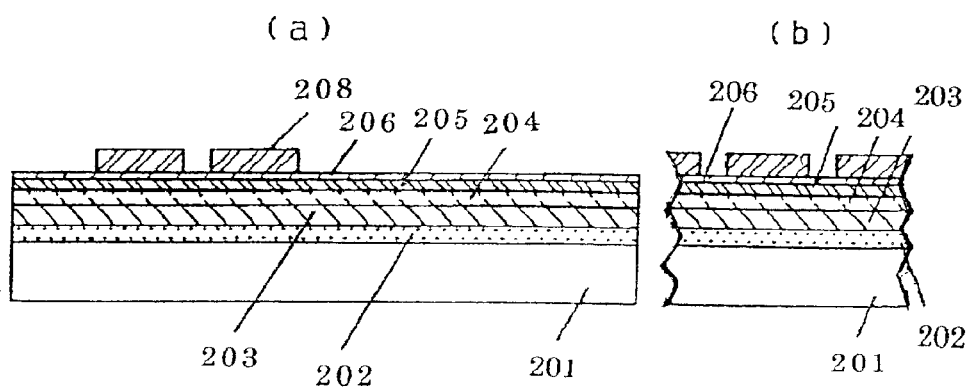
FIGS. 14(a) and 14(b) are views illustrating a process step for fabricating a TFT array in accordance with Example 2-3 of the present invention.

Next, a first resist pattern 208 for the first photolithography was formed by a conventional method (FIGS. 14(*a*) and 14(*b*)).

Figure 15:
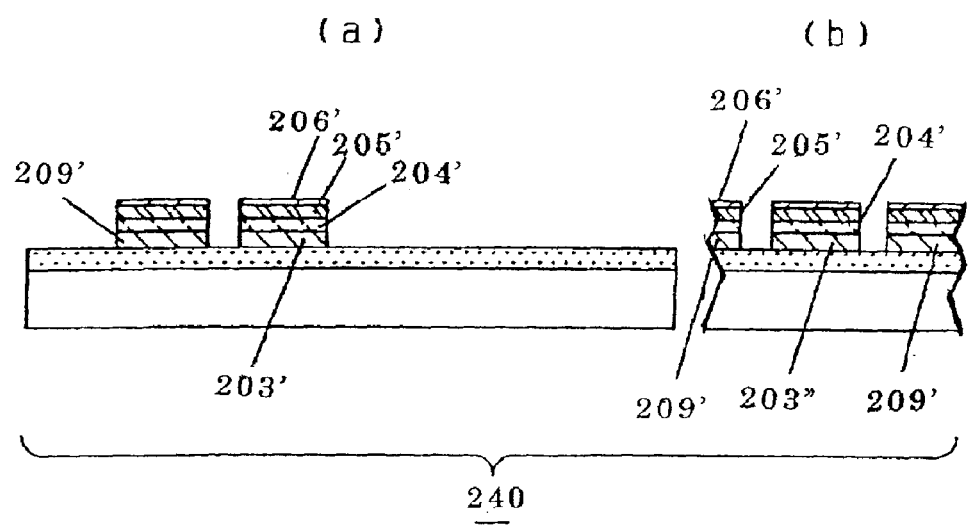
FIGS. 15(a) and 15(b) are views illustrating a process step for fabricating the TFT array in accordance with Example 2-3 of the present invention.

Thereafter, the n+a-Si film layer 206, the i-type a-Si film layer 205, the gate insulating film layer 204 ($SiN_x$ film), and the G-S metal film layer 203 (Al—Zr film) were sequentially etched, thereby forming a first pattern 240 including a gate electrode 203' or a gate wiring line 203", a source segmented wiring line 209', a gate insulating film 204', and a semiconductor film (205'+206') which were stacked (FIGS. 15(*a*) and 15(*b*)).

Figure 16:
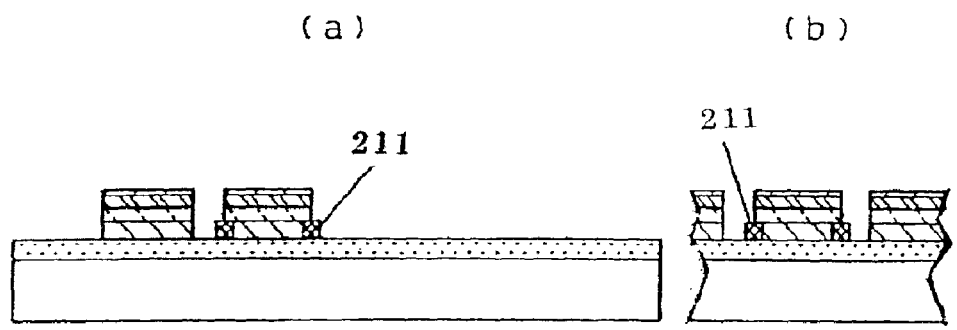
FIGS. 16(a) and 16(b) are views illustrating a process step for fabricating the TFT array in accordance with Example 2-3 of the present invention.
Figure 17:
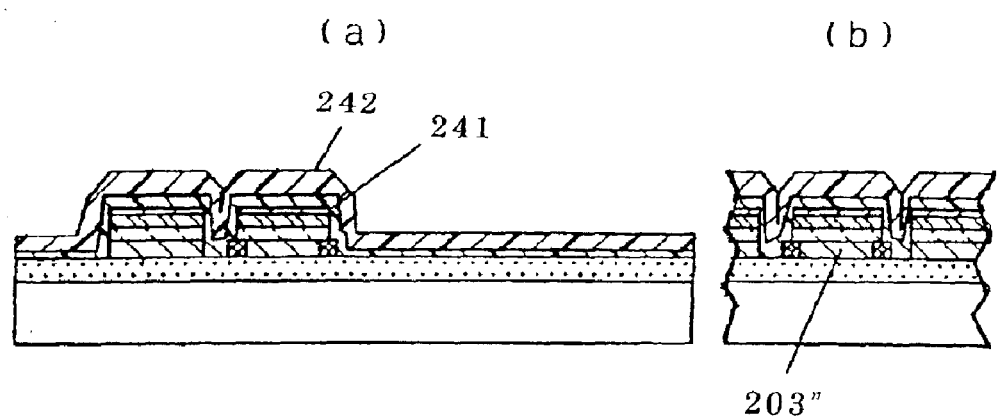
FIGS. 17(a) and 17(b) are views illustrating a process step for fabricating the TFT array in accordance with Example 2-3 of the present invention.

Then, the gate electrode 203' and the gate wiring line 203" were anodically oxidized in an electrolyte to form insulating films 211, mainly composed of $Al_2O_3$, on the side surfaces of the gate electrode and the side surfaces of the gate wiring line (FIGS. 16(*a*) and 16(*b*)). Thereafter, a contact metal film (Ti) 241 and a metal electrode film 242 composed of an aluminum film (Al) were vapor deposited by sputtering to film thicknesses of about 50 nm and 100 nm, respectively. The contact metal film and the metal electrode film were to be connected to pixel metal electrodes connected to drain regions and were to connect together segments of each severed source segmented wiring line connected to source regions (FIGS. 17(*a*) and 17(*b*)).

Figure 18:
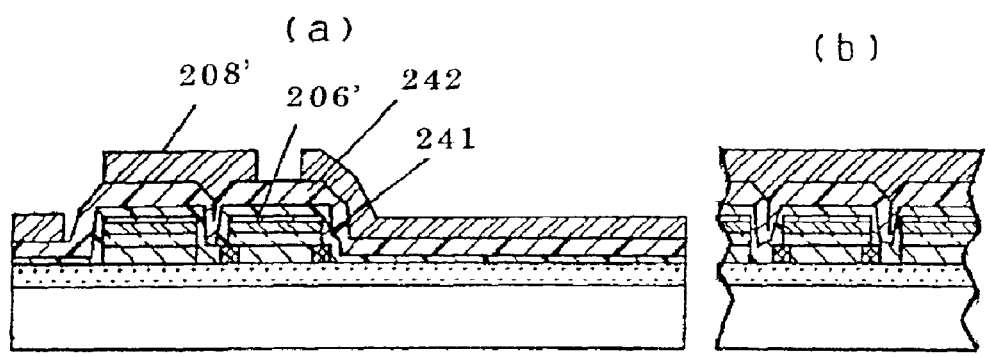
FIGS. 18(a) and 18(b) are views illustrating a process step for fabricating the TFT array in accordance with Example 2-3 of the present invention.
Figure 19:
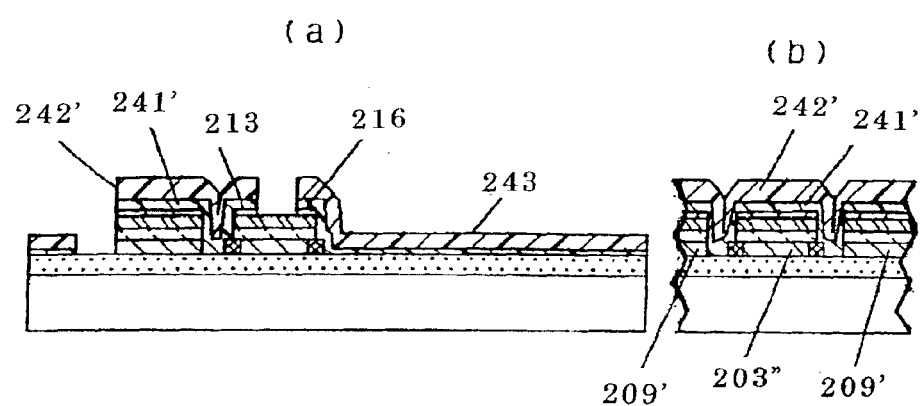
FIGS. 19(a) and 19(b) are views illustrating a process step for fabricating the TFT array in accordance with Example 2-3 of the present invention.

Subsequently, a second resist pattern 208' for the second photolithography was formed by a conventional method (FIGS. 18(*a*) and 18(*b*)). Then, part of the metal electrode film 242, the contact metal film (Ti) 241, and the n+a-Si film 206' on the gate electrode were sequentially etched away, thus forming channel regions, The source segmented wiring line 209' was connected to a source region 213 by a portion of a contact metal film (Ti) 241' and a metal electrode film pattern 242', and a pixel metal electrode film 243 was connected to a drain region 216 by the contact electrode metal 241' (FIGS. 19(*a*) and 19(*b*)). At this point, segments of the source segmented wiring line 209', which had been previously severed and disconnected, were connected together on the gate wiring line 203" by the portion of the contact metal film (Ti) 241' and the metal electrode film pattern 242' (FIG. 19(*b*)).

Figure 20:
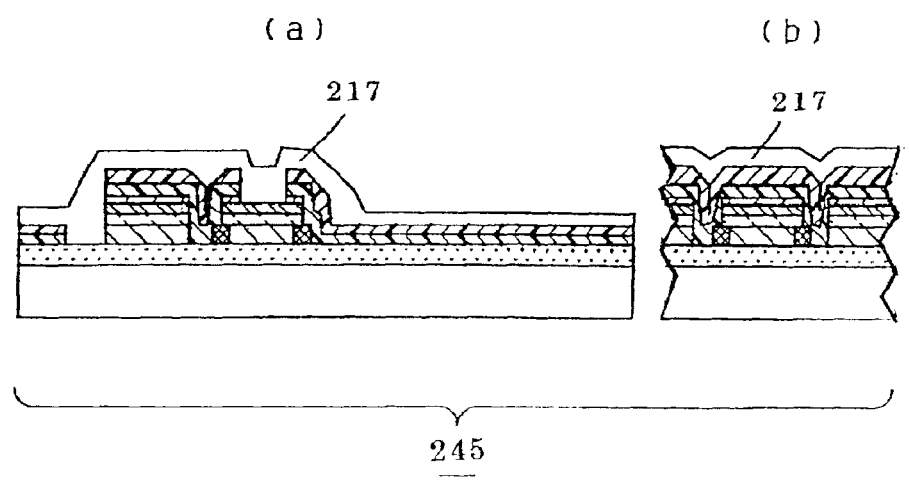
FIGS. 20(a) and 20(b) are views illustrating a process step for fabricating the TFT array in accordance with Example 2-3 of the present invention.

Finally, by using printing and baking a silica passivation film 217 of 300 nm was formed on the substrate, except for the periphery thereof, so as to cover the TFTs. Thereafter, using this silica passivation film pattern as a mask, portions of the oxide film on the gate electrode metal, which are to be connected to driving circuitry, were etched away, thus producing a TFT array substrate 245 having reflective pixel metal electrodes in the pixel portions (FIGS. 20(*a*) and 20(*b*)).

According to the present example, segments of each source segmented wiring line are connected together by the two layers of the contact electrode metal and the metal electrode, and therefore the resistance of the source segmented wiring lines was made extremely low.

In addition, by using aluminum or an aluminum-based alloy (such as an Al—Zr or Ag—Pd—Cu alloy) for the reflective pixel metal electrode, it was possible to fabricate a TFT array substrate with excellent reflectivity.

Moreover, by vapor depositing the silica-based undercoat film between the surface of the insulating substrate and the gate wiring line metal film by a sol-gel method, it was possible to absorb substrate deformation.

Forming the aluminum-based alloy film for the gate wiring line metal film made it possible to fabricate a TFT array substrate having few irregularities on the surface of the wiring lines.

In the step of oxidation, by carrying out anodic oxidation in a neutral solution, it was possible to fabricate a TFT array substrate having good gate insulating properties.

Here, when the oxide films of the side surfaces of the gate electrodes were neutral, anodic oxide films, it was possible to fabricate a TFT array substrate with high reliability.

In addition, when part of the source segmented wiring line had a five-layered structure composed of the gate wiring line metal film, the gate insulating film, the semiconductor film, the contact metal film, and the metal electrode film, it was possible to reduce the resistance of the source segmented wiring lines.

Forming the silicon nitride-based gate insulating film and the semiconductor film between the gate electrode metal and the contact electrode metal made it possible to fabricate a TFT array substrate having excellent stability.

When segments of each source segmented wiring line, which had been severed by the gate wiring lines, were interconnected together on the gate wiring lines by the two layers of the contact electrode metal and the metal electrode, it was possible to minimize level differences on the surface of the TFT array substrate.

Further, when part of the semiconductor film had a two-layered structure composed of an i-type layer and an n+-type layer, it was possible to reduce the contact resistance of the source and the drain.

Furthermore, when the undercoat film was formed between the surface of the insulating substrate and the gate wiring line metal film, it was possible to fabricate a TFT array substrate with high reliability.

EXAMPLE 2-4

Figure 21:
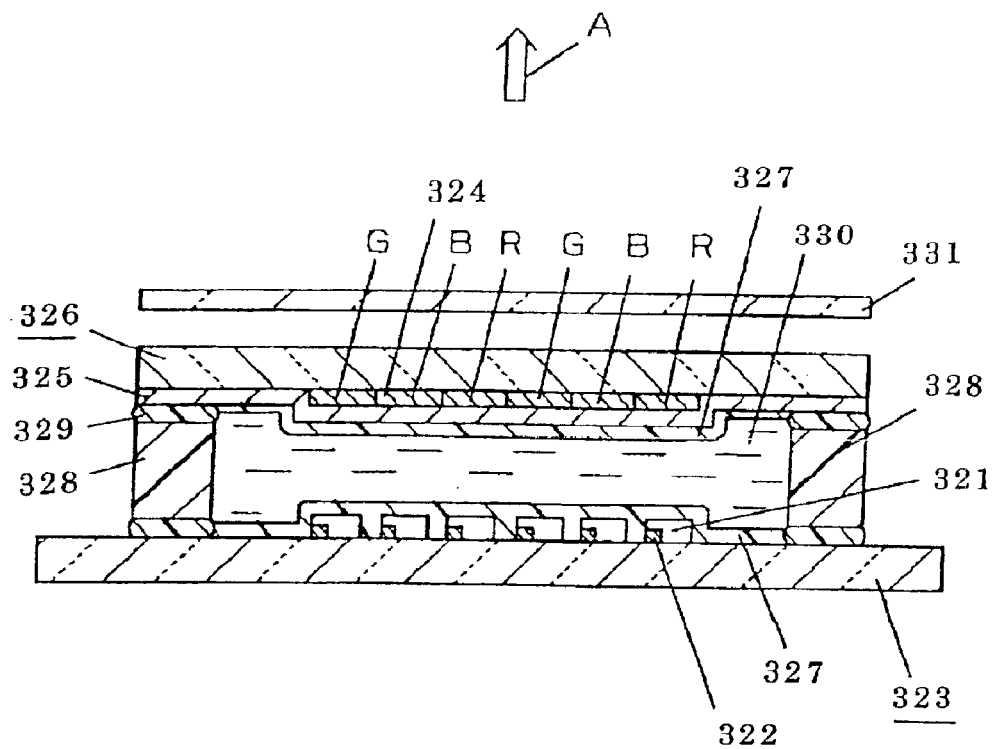
FIG. 21 is a schematic cross-sectional view illustrating a liquid crystal display device in accordance with Example 2-4 of the present invention.

The actual fabrication process of a liquid crystal display device using the TFT array substrate obtained in Example 2-3 is described with reference to FIG. 21.

First, there were provided a TFT array substrate, similar to that of Example 2-3, fabricated using two masks, more specifically, a first TFT array substrate 323 including a first electrode group 321 arranged in a matrix and a transistor group 322 that drives the first electrodes; and a second color filter substrate 326 including a second electrode 325 and a color filter group 324 placed opposite to the first electrode group. Over each of the substrates, by a conventional method, a polyimide resin was applied and cured, and the resulting films were subjected to rubbing, thus producing liquid crystal alignment films 327.

Next, the first and second substrates 323 and 326 were arranged such that their respective electrodes oppose one another, thus producing a cell having a gap of about 5 microns created by spacers 328 and adhesives 329. A TN liquid crystal 330 was then injected between the first and second substrates, and a polarizer 331 was arranged on the cell surface of the color filter side, thus completing a reflective liquid crystal display device.

Such a device was capable of displaying images in the direction of the arrow A, by driving each transistor using video signals.

EXAMPLE 2-5

In a manner similar to that described in Example 2-1, a transparent glass substrate that had been thoroughly cleaned in advance was prepared, and a silica ($SiO_2$) film, serving as an undercoat film layer, was deposited by CVD to 0.4 microns. Then, an Al—Zr (97:3) alloy, serving as a G-S metal film layer for gate electrodes, gate wiring lines, and source segmented wiring lines, was vapor deposited by sputtering to a film thickness of about 200 nm. Subsequently, a $SiN_x$ film, serving as a gate insulating film layer, was deposited by plasma enhanced CVD to 150 nm, followed by, as a semiconductor film, an amorphous silicon (i-type a-Si) film layer not containing impurities and an amorphous silicon (n+a-Si) film layer containing an n-type impurity to 50 nm and 50 nm, respectively. Finally, a Ti metal film, serving as a contact metal film layer, was vapor deposited by sputtering to a film thickness of about 100 nm. Thereafter, a first resist pattern for the first photolithography, which includes first comb-shaped pixel electrodes, was formed by a conventional method.

Then, the contact metal film layer (Ti), the n+a-Si film layer, the i-type a-Si film layer, the gate insulating film layer ($SiN_x$ film), and the G-S metal film layer (Al—Zr film) were sequentially etched, thereby forming a first pattern including a gate electrode or a gate wiring line, a source segmented wiring line, a gate insulating film layer, and a semiconductor film, which were stacked, and a first comb-shaped pixel metal electrode 251.

Next, the gate electrode, the gate wiring line, and the first comb-shaped pixel metal electrode 251 were anodically oxidized in an electrolyte using ammonium borate and having a pH in the neighborhood of 7, to form insulating films, mainly composed of $Al_2O_3$, on the side surfaces of the pattern.

Further, a metal (Al) electrode film was vapor deposited by sputtering to a film thickness of about 100 nm. The metal electrode film was to be connected to source regions and to second comb-shaped pixel metal electrodes connected to drain regions and was to connect together segments of each severed source segmented wiring line.

Subsequently, a second resist pattern for the second photolithography was formed by a conventional method. Then, part of the metal electrode film, the contact electrode metal, and the n+a-Si film on the gate electrode were sequentially etched away through to the i-type a-Si film, thus forming channel regions. The source segmented wiring line was connected to a source region by a portion of the contact electrode metal and a metal electrode, and a second comb-shaped pixel metal electrode was connected to a drain region by a portion of the contact electrode metal.

At this point, the source segmented wiring lines, which had been previously severed, were connected together on the gate wiring line by the metal electrode film pattern via a portion of the contact electrode metal.

Figure 22:
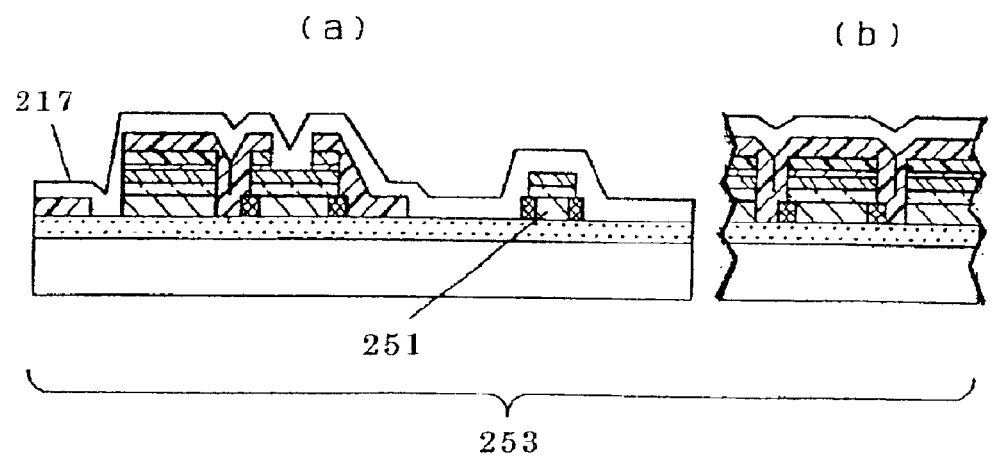
FIGS. 22(a) and 22(b) are schematic cross-sectional views of a TFT in accordance with Example 2-5 of the present invention.

Finally, by using printing and baking a silica passivation film 217 of 300 nm was formed so as to cover the TFTs, and subsequently using this silica passivation film pattern as a mask, portions of the i-type a-Si film and the $SiN_x$ film on the gate electrode metal, which are to be connected to external driving circuitry, were etched away, thus producing a TFT array substrate 253 applicable to in-plane switching (IPS) mode liquid crystal display devices (FIGS. 22(a) and 22(b)).

Here, by simultaneously etching portions that are to be formed into gate wiring lines, gate electrodes, and first comb-shaped pixel electrodes, it was possible to fabricate a TFT array substrate for the IPS mode device, without additional masks.

In addition, carrying out the step of forming an undercoat film between the surface of the insulating substrate and the gate wiring line metal film made it possible to fabricate a TFT array substrate having excellent stability.

Moreover, by sequentially forming the gate wiring line metal film, the gate insulating film, and the semiconductor film, it was possible to prevent contamination of the channel portions.

In the oxidation step, carrying out anodic oxidation in a neutral electrolyte made it possible to selectively oxidize and insulate only the side surfaces of the gate electrodes, the side surfaces of the gate wiring lines, and the side surfaces of the first comb-shaped pixel electrodes.

When the first comb-shaped pixel electrodes and part of the source segmented wiring line had a five-layered structure composed of the gate wiring line metal film, the gate insulating film, the semiconductor film, the contact metal film layer, and the metal electrode film, it was possible to provide a TFT array substrate having little resistance of the source segmented wiring line.

Further, when the contact electrode metal was formed for connecting the semiconductor films and the comb-shaped electrodes, it was possible to provide a TFT array substrate having low drain contact resistance.

When segments of each source segmented wiring line, which had been severed by the gate wiring lines and the first comb-shaped electrodes, were interconnected together on the gate wiring lines and the first comb-shaped electrodes by the contact electrode metal and the metal electrode, it was possible to provide a TFT array substrate having few level differences on the surface.

Moreover, when part of the semiconductor film had a two-layered structure composed of an i-type layer and an n-type layer, it was possible to provide a TFT array substrate having even lower contact resistance.

By forming an undercoat film between the surface of the insulating substrate and the gate wiring line metal film, it was possible to prevent impurities migrating from the substrate from diffusing, providing a TFT array substrate with high reliability.

EXAMPLE 2-6

The actual fabrication process of an IPS mode liquid crystal display device using the above-described TFT array substrate is described.

First, there were provided a TFT array substrate for the IPS mode device, similar to that of Example 2-5, fabricated using two masks, more specifically, a first TFT array substrate including a first comb-shaped electrode group and a second comb-shaped electrode group arranged in a matrix and a transistor group that drives the first comb-shaped electrode group; and a second color filter substrate including a color filter group placed opposite to the first and second electrode groups. Over each of the substrates, by a conventional method, a polyimide resin was applied and cured, and the resulting films were subjected to rubbing, thus producing liquid crystal alignment films.

Next, the first and second substrates were arranged such that their respective alignment films oppose one another, thus producing a cell having a gap of about 5 microns created by spacers and adhesives. Thereafter, a nematic liquid crystal was injected between the first and second substrates, and polarizers were then arranged so as to have a crossed Nicols relation, thus completing a display device.

Such a device was capable of displaying images by driving each transistor using video signals while lighting, using the backlight from the backside. Here, the device achieved a wide viewing angle of 160° horizontally and vertically with a contrast of 10.

At this point, after the step of fabricating TFT array substrate for the IPS mode device prior to the formation of the alignment films, by carrying out the step of covering at least part of the TFT array substrate by a passivation film, it was possible to fabricate a liquid crystal display device with high reliability.

Here, after the step of fabricating the bottom-gate TFT array substrate prior to the formation of the alignment films, by covering at least part of the TFT array substrate by a passivation film and etching, with use of this passivation film as a mask, the metal electrode film, the contact electrode metal film, the semiconductor film, and the gate insulating film to expose gate wiring line terminals, it was possible to fabricate a liquid crystal display device at low cost.

In addition, for the passivation film, forming a film composed of an inorganic substance such as a silica film or a silicon nitride film made it possible to fabricate a liquid crystal display device with excellent reliability.

EXAMPLE 2-7

In a manner similar to that described in Example 2-3, a transparent glass substrate that had been thoroughly cleaned in advance was prepared, and a silica ($SiO_2$) film, serving as an undercoat film layer, was deposited by CVD to 0.4 microns. Then, an Al—Zr (97:3) alloy, serving as a G-S metal film layer for gate electrodes, gate wiring lines, and source segmented wiring lines, was vapor deposited by sputtering to a film thickness of about 200 nm. Subsequently, a $SiN_x$ film, serving as a gate insulating film, was deposited by plasma enhanced CVD to 150 nm, followed by, as a semiconductor film, an amorphous silicon (i-type a-Si) film not containing impurities and an amorphous silicon (n+a-Si) film containing an n-type impurity to 200 nm and 50 nm, respectively. Then, a first resist pattern for the first photolithography, which includes first comb-shaped pixel electrodes, was formed by a conventional method.

Thereafter, the n+a-Si film, the i-type a-Si film, the $SiN_x$ film, and the Al—Zr film were sequentially etched, thereby forming a first pattern including a gate electrode or a gate wiring line, a source segmented wiring line, a gate insulating film layer, and a semiconductor film, which were stacked, and a first comb-shaped pixel electrode 261.

Next, the gate electrode, the gate wiring line, and the first comb-shaped pixel electrode 261 were anodically oxidized in an electrolyte of ammonium borate to form insulating films, mainly composed of $Al_2O_3$, on the side surfaces of the pattern.

Further, a contact metal film layer (Ti) and a metal electrode film composed of an aluminum film (Al) were vapor deposited by sputtering to film thicknesses of about 50 nm and 100 nm, respectively. The contact electrode metal film and the metal electrode film were to be connected to source regions and to second comb-shaped pixel metal electrodes connected to drain regions and were to connect together segments of each severed source segmented wiring line.

Subsequently, a second resist pattern for the second photolithography, which includes second comb-shaped pixel metal electrodes, was formed by a conventional method. Then, part of the metal electrode film, the contact metal film layer (Ti), and the n+a-Si film on the gate electrode were sequentially etched away, thus forming channel regions. The source segmented wiring line was connected to a source region by a portion of a contact metal film layer (Ti) and a metal electrode film pattern, and a second comb-shaped pixel metal electrode 262 was connected to a drain region by a portion of the contact electrode metal.

At this point, segments of the source segmented wiring line, which had been previously severed, were connected together on the gate wiring line by the portion of the contact metal film layer (Ti) pattern and the metal electrode film pattern.

Figure 23:
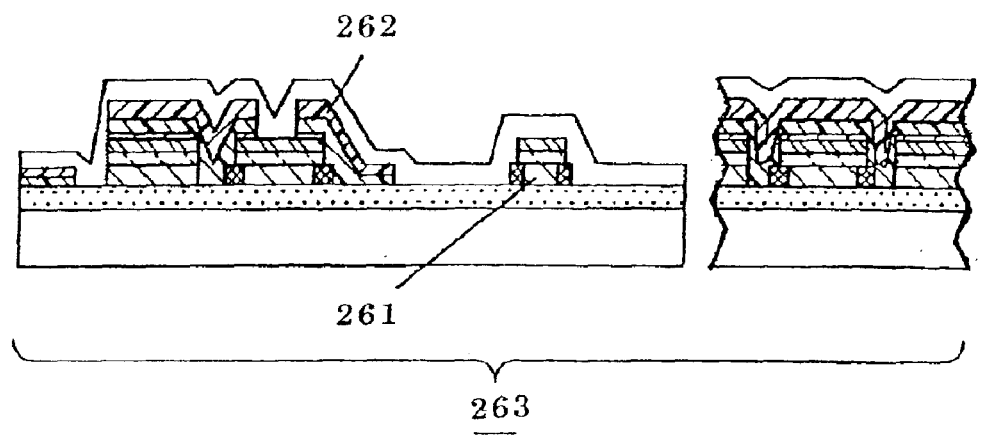
FIGS. 23(a) and 23(b) are schematic cross-sectional views of a TFT in accordance with Example 2-7 of the present invention.

Finally, by using printing and baking a passivation film of 300 nm was formed so as to cover the TFTs, and subsequently using this silica passivation film pattern as a mask, portions of the oxide film on the gate electrode metal which were to be connected to driving circuitry were etched away, thus producing a TFT array substrate 263 having the second comb-shaped pixel metal electrodes in the pixel portions (FIGS. 23(a) and 23(b)).

Here, when the semiconductor film had a two-layered structure composed of an i-type layer and an n-type layer and part of the n-type layer was etched to the i-type layer, it was possible to fabricate a TFT array substrate at low cost without additional masks.

Further, by forming an undercoat film between the surface of the insulating substrate and the gate wiring line metal film, it was possible to prevent impurities generating from the substrate from diffusing, allowing fabrication of a TFT array substrate with high reliability.

When the gate wiring line metal film, the gate insulating film, and the semiconductor film were sequentially formed, contamination of the channel portions was kept to a minimum, allowing fabrication of a TFT array substrate having stable Vt.

In the step of oxidation, by carrying out anodic oxidation in a neutral solution, it was possible to fabricate a TFT array substrate having few pinholes and little leakage current.

Moreover, when part of the TFT array substrate was covered, using a sol-gel method, by a passivation film composed of silica or a silica-containing inorganic substance, it was possible to fabricate a TFT array substrate with high reliability.

EXAMPLE 2-8

The actual fabrication process of a liquid crystal display device using the above-described TFT array substrate is described.

First, there were provided a TFT array substrate for the IPS mode device, similar to that of Example 2-7, fabricated using two masks, more specifically, a first TFT array substrate including a first comb-shaped electrode group and a second comb-shaped electrode group arranged in a matrix and a transistor group that drives the first comb-shaped electrode group; and a second color filter substrate including a color filter group placed opposite to the first and second electrode groups. Over each of the substrates, by a conventional method, a polyimide resin was applied and cured, and the resulting films were subjected to rubbing, thus producing liquid crystal alignment films.

Next, the first and second substrates were arranged such that their respective alignment films oppose one another, thus producing a cell having a gap of about 4 microns created by spacers and adhesives. In addition, a nematic liquid crystal was injected between the first and second substrates, and two polarizers were then arranged so as to have a crossed Nicols relation, thus completing a display device.

Such a device was capable of displaying images by driving each transistor using video signals while lighting, using the backlight from the backside. Here, the device achieved a wide viewing angle of 160° horizontally and vertically with a contrast of 10.

Here, after the step of fabricating the TFT array substrate prior to the formation of the alignment films, by carrying out the step of covering at least part of the TFT array substrate by a passivation film such as silica, it was possible to fabricate a liquid crystal display device with high reliability.

Furthermore, when the metal electrode and the contact metal electrode were formed in a single layer with the same material, it was possible to further simplify the process.

EXAMPLE 2-9

In a manner similar to that described in Example 2-1, a transparent glass substrate that had been thoroughly cleaned in advance was prepared, and a silica ($SiO_2$) film, serving as an undercoat film layer, was deposited by CVD to 0.4 microns. Then, an Al—Zr (97:3) alloy, serving as a G-S metal film layer for gate electrodes, gate wiring lines, and source segmented wiring lines, was vapor deposited by sputtering to a film thickness of about 200 nm. Subsequently, a $SiN_x$ film, serving as a gate insulating film layer, was deposited by plasma enhanced CVD to 150 nm, followed by, as a semiconductor film, an amorphous silicon (i-type a-Si) film not containing impurities and an amorphous silicon (n+a-Si) film containing an n-type impurity to 50 nm and 50 nm, respectively. Finally, a Ti metal film, serving as a contact metal film layer, was vapor deposited by sputtering to a film thickness of about 100 nm. Thereafter, a first resist pattern for the first photolithography was formed by a conventional method.

Then, the Ti metal film, the n+a-Si film, the i-type a-Si film, the $SiN_x$ film, and the Al—Zr film were sequentially etched, thereby forming a first pattern including a gate electrode or a gate wiring line, a source segmented wiring line, a gate insulating film layer, a semiconductor film, and a contact electrode metal which were stacked.

Next, the gate electrode and the gate wiring line were anodically oxidized in an electrolyte using ammonium borate and having a pH in the neighborhood of 7, to form insulating films, mainly composed of $Al_2O_3$, on the side surfaces of the pattern.

Further, a metal electrode film was vapor deposited by sputtering to a film thickness of about 100 nm. The metal electrode film was to be connected to source regions and to first comb-shaped pixel metal electrodes connected to drain regions and was to connect together segments of each severed source segmented wiring line.

Subsequently, a second resist pattern for the second photolithography, which includes a first comb-shaped electrode pattern, was formed by a conventional method. Then, part of the transparent conductive film, the contact electrode, and the n+a-Si film on the gate electrode were sequentially etched away through to the i-type a-Si film, thus forming channel regions. The source segmented wiring line was connected to a source region by a portion of the contact electrode metal and a metal electrode, and the first comb-shaped pixel metal electrode 271 was connected to a drain region by a portion of the contact electrode metal.

At this point, the source segmented wiring lines, which had been previously severed, were connected together on the gate wiring line by the metal electrode via a portion of the contact electrode metal.

Subsequently, a silica passivation film of 300 nm was formed by printing and baking, using a sol-gel method, so as to cover the TFTs. Thereafter, using this silica passivation film pattern as a mask, portions of the i-type a-Si film and the $SiN_x$ film on the gate electrode metal, which are to be connected to external driving circuitry, were etched away.

Figure 24:
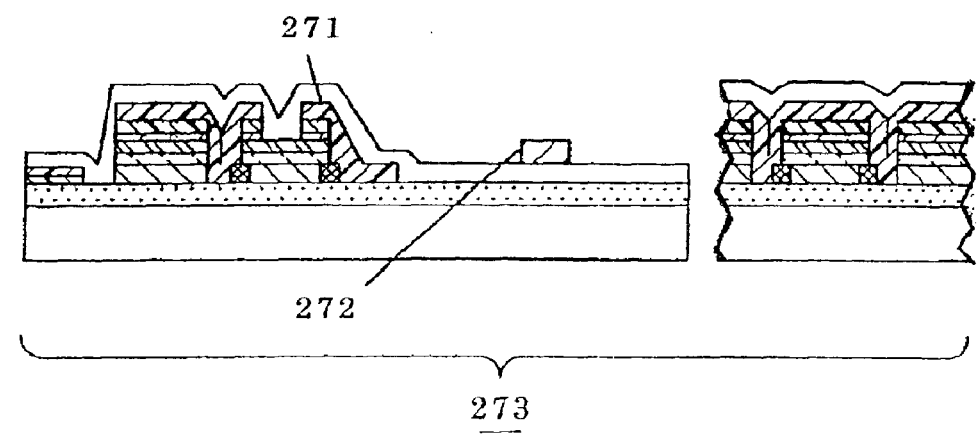
FIGS. 24(a) and 24(b) are schematic cross-sectional views of a TFT in accordance with Example 2-9 of the present invention.

An Al—Zr alloy was then vapor deposited on the entire surface to a film thickness of 150 nm, and using a photomask having a second comb-shaped electrode pattern, a second comb-shaped pixel metal electrode 272 was formed, thus producing a TFT array substrate 273 applicable to IPS mode transmissive liquid crystal display devices, with the use of three photomasks (FIGS. 24(a) and 24(b)).

Here, when the semiconductor film had a two-layered structure composed of an i-type layer and an n-type layer and part of the n-type layer was etched to the i-type layer, it was possible to simplify the TFT process.

In addition, forming an undercoat film between the surface of the insulating substrate and the gate wiring line metal film made it possible to fabricate a TFT array substrate having stable characteristics.

When at least the gate wiring line metal film, the gate insulating film, and the semiconductor film were sequentially formed, it was possible to prevent contamination of the channel interfaces.

In the step of oxidation, by carrying out anodic oxidation, it was possible to form an insulating film having few pinholes, allowing fabrication of a TFT array substrate having little gate leakage.

Here, when the oxide films of the side surfaces of the gate electrodes were formed of anodic oxide films, it was possible to fabricate a TFT array substrate having excellent leakage characteristics.

Furthermore, when part of the source segmented wiring line had a five-layered structure composed of the gate wiring line metal film, the gate insulating film, the semiconductor film, the contact metal film layer, and the metal electrode film, it was possible to reduce the resistance of the source segmented wiring line, allowing fabrication of a TFT array substrate having few variations in characteristics.

When a contact electrode metal was formed between the semiconductor film and the source/drain electrodes, it was possible to fabricate a TFT array substrate having little internal resistance.

Moreover, when segments of each source segmented wiring line, which had been severed by the gate wiring lines, were interconnected together on the gate wiring lines by the contact electrode metal and the metal electrode, it was possible to fabricate a TFT array substrate having a low resistance of the source segmented wiring line.

When part of the semiconductor film had a two-layered structure composed of an i-type layer and an n-type layer, it was possible to omit the step of diffusing an n-type impurity.

Forming an undercoat film between the surface of the insulating substrate and the gate wiring line metal film made it possible to minimize the influence of the substrate deformation.

EXAMPLE 2-10

The actual fabrication process of a liquid crystal display device using the TFT array substrate produced in the foregoing Example 2-9 is described.

First, there were provided a TFT array substrate, similar to that of Example 2-9, fabricated using two masks, more specifically, a first TFT array substrate including a first comb-shaped electrode group and a second comb-shaped electrode group arranged in a matrix and a transistor group that drives the first comb-shaped electrode group; and a second color filter substrate including a color filter group placed opposite to the first and second comb-shaped electrode groups. Over each of the substrates, by a conventional method, a polyimide resin was applied and cured, and the resulting films were subjected to rubbing, thus producing liquid crystal alignment films.

Next, the first and second substrates were arranged such that their respective alignment films oppose one another, thus producing a cell having a gap of about 5 microns, which is created by spacers and adhesives. Thereafter, a TN liquid crystal was injected between the first and second substrates, and polarizers were then arranged so as to have a crossed Nicols relation, thus completing a display device.

Such a device was capable of displaying images by driving each transistor using video signals while lighting, using the backlight from the backside. Here, the device achieved a wide viewing angle of 160° horizontally and vertically with a contrast of 210.

Here, after the step of fabricating the TFT array substrate prior to the formation of the alignment films, by carrying out the step of covering at least part of the TFT array substrate by a passivation film such as silica, it was possible to fabricate a liquid crystal display device with high reliability.

EXAMPLE 2-11

In a manner similar to that described in Example 2-8, a transparent glass substrate that had been thoroughly cleaned in advance was prepared, and a silica ($SiO_2$) film, serving as an undercoat film layer, was deposited by CVD to 0.4 microns. Then, an Al—Zr (97:3) alloy, serving as a G-S metal film layer for gate electrodes, gate wiring lines, and source segmented wiring lines, was vapor deposited by sputtering to a film thickness of about 200 nm. Subsequently, a $SiN_x$ film, serving as a gate insulating film layer, was deposited by plasma enhanced CVD to 150 nm, followed by, as a semiconductor film, an amorphous silicon (i-type a-Si) film not containing impurities and an amorphous silicon (n+a-Si) film containing an n-type impurity to 50 nm and 50 nm, respectively, and then a first resist pattern for the first photolithography was formed by a conventional method.

Thereafter, the n+a-Si film, the i-type a-Si film, the $SiN_x$ film, and the Al—Zr film were sequentially etched, thereby forming a first pattern including a gate electrode or a gate wiring line, a source segmented wiring line, a gate insulating film layer, and a semiconductor film which were stacked.

Next, the gate electrode and the gate wiring line were anodically oxidized in an electrolyte using ammonium borate and having a pH in the neighborhood of 7, to form insulating films, mainly composed of $Al_2O_3$, on the side surfaces of the pattern.

Further, a Ti metal film, serving as a contact metal film layer, was vapor deposited by sputtering to a film thickness of about 100 nm, and subsequently an Al—Zr film, serving as a metal electrode film, was vapor deposited by sputtering to a film thickness of about 100 nm. The contact metal film layer and the metal electrode film are to be connected to source regions and to first comb-shaped pixel metal electrodes connected to drain regions, and to connect together segments of each severed source segmented wiring line.

Thereafter, a second resist pattern for the second photolithography, which includes a first comb-shaped electrode pattern, was formed by a conventional method. Subsequently, part of the transparent conductive film, the contact metal film layer, and the n+a-Si film on the gate electrode were sequentially etched away through to the i-type a-Si film, thus forming channel regions. The source segmented wiring line was connected to a source region by a portion of the contact electrode metal and a metal electrode, and the first comb-shaped pixel metal electrode 281 was connected to a drain region by a portion of the contact electrode metal.

At this point, the source segmented wiring lines, which had been previously severed, were connected together on the gate wiring line by the two-layered structure composed of the metal electrode and a portion of the contact electrode metal.

Subsequently, a silica passivation film of 300 nm was formed by printing and baking, using a sol-gel method, so as to cover the TFTs. Thereafter, using this silica passivation film pattern as a mask, portions of the i-type a-Si film and the $SiN_x$ film on the gate electrode metal, which are to be connected to external driving circuitry, were etched away.

Figure 25:
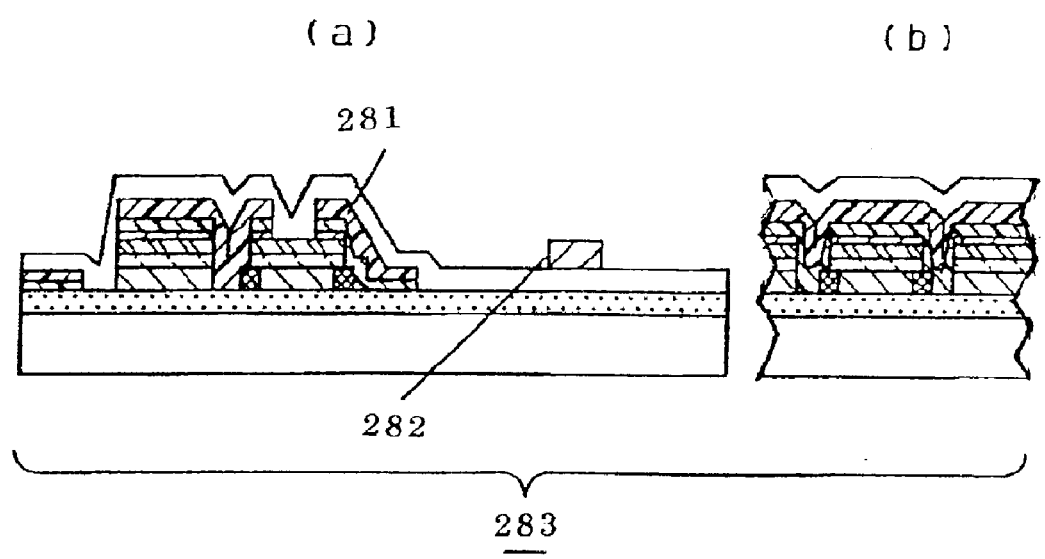
FIGS. 25(a) and 25(b) are schematic cross-sectional views of a TFT in accordance with Example 2-11 of the present invention.

Finally, an Al—Zr alloy was once again vapor deposited on the entire surface to a film thickness of 150 nm, and using a photomask having a second comb-shaped electrode pattern, a second comb-shaped pixel metal electrode 282 was formed, thus producing a TFT array substrate 283 applicable to IPS mode transmissive liquid crystal display devices, with the use of three photomasks (FIGS. 25(*a*) and 25(*b*)).

Consequently, because at least segments of each source segmented wiring line were connected together by the two-layered structure composed of the metal electrode and the contact electrode metal, it was possible to reduce the resistance of the source segmented wiring line, allowing fabrication of a TFT array substrate having excellent image display characteristics.

EXAMPLE 2-12

The actual fabrication process of a liquid crystal display device using the TFT array substrate produced in the foregoing Example 2-11 is described.

First, there were provided a TFT array substrate, similar to that of Example 2-11, fabricated using two masks, more specifically, a first TFT array substrate including a first comb-shaped electrode group and a second comb-shaped electrode group arranged in a matrix and a transistor group that drives the first comb-shaped electrode group; and a second color filter substrate including a color filter group placed opposite to the first and second comb-shaped electrode groups. Over each of the substrates, by a conventional method, a polyimide resin was applied and cured, and the resulting films were subjected to rubbing, thus producing liquid crystal alignment films.

Next, the first and second substrates were arranged such that their respective alignment films oppose one another, thus producing a cell having a gap of about 5 microns, which is created by spacers and adhesives. Thereafter, a TN liquid crystal was injected between the first and second substrates, and polarizers were then arranged so as to have a crossed Nicols relation, thus completing a display device.

Such a device was capable of displaying images by driving each transistor using video signals while lighting, using the backlight from the backside. Here, the device achieved a wide viewing angle of 160° horizontally and vertically with a contrast of 10.

Here, after the step of fabricating the TFT array substrate prior to the formation of the alignment films, by carrying out the step of covering at least part of the TFT array substrate by a passivation film such as silica, it was possible to fabricate a liquid crystal display device with high reliability.

INDUSTRIAL APPLICABILITY

As has been explained above, according to the present invention, it is possible to fabricate an electrical circuit board having X-Y wiring lines that intersect one another in the plane, with extremely high productivity. Such an electrical circuit board is applicable in a wide range of electronic device applications. In addition, the TFT array substrates in accordance with the present invention, to which such an electrical circuit board is applied, can be fabricated with the use of two photomasks, and therefore a substantial reduction in the fabrication costs of TFT array substrates is achieved. Moreover, using such TFT array substrates produces the advantageous effect of providing liquid crystal display devices at a lower cost. Thus, the value of the present invention to industry is considerable.

What is claimed is:

1. An electrical circuit board comprising:

X wiring lines and Y segmented wiring lines, each of the wiring lines being formed of a same conductive metal film and in a same plane on an insulating substrate and the Y segmented wiring lines intersecting the X wiring lines and being severed at the intersections with the X wiring lines, and spaced apart from the X wiring lines;

wherein top and side surfaces of the X wiring lines are covered with an insulating film;

segments of each of the Y segmented wiring lines are electrically connected together by a Y segmented wiring line-connecting electrode formed on the insulating film, the Y segments being spaced apart by the X wiring lines and the covering insulating film; wherein the insulating film covering the side surfaces of the X wiring lines is an insulating metal oxide film formed by oxidizing the side surfaces of the X wiring lines.

2. The electrical circuit board according to claim 1, wherein the insulating metal oxide film is an anodic oxide film formed by oxidizing the side and top surfaces of the X wiring lines by anodic oxidation.

3. An electrical circuit board comprising:

X wiring lines and Y segmented wiring lines, each of the wiring lines comprising a same conductive metal film and in a same plane on an insulating substrate and the Y segmented wiring lines intersecting the X wiring lines and being severed at the intersections with the X wiring lines and spaced apart from the X wiring lines;

wherein top and side surfaces of the X wiring lines are covered with an insulating film of an oxide of said same conductive metal;

wherein segments of each of the Y segmented wiring lines are electrically connected together by a Y segmented wiring line-connecting electrode formed on the insulating film, the segments being spaced apart by the X wiring lines and the covering insulating metal oxide film.

4. The electrical circuit board according to claim 3, wherein the insulating metal oxide film is an anodic oxide film on the top and side surfaces of the X wiring lines.

* * * * *